(12) United States Patent
McGuire, Jr.

(10) Patent No.: US 7,481,544 B2
(45) Date of Patent: Jan. 27, 2009

(54) GRAZING INCIDENCE RELAYS

(75) Inventor: James P. McGuire, Jr., Pasadena, CA (US)

(73) Assignee: Optical Research Associates, Pasadena, CA (US)

( * ) Notice: Subject to any disclaimer, the term of this patent is extended or adjusted under 35 U.S.C. 154(b) by 258 days.

(21) Appl. No.: 11/066,606

(22) Filed: Feb. 25, 2005

(65) Prior Publication Data

US 2005/0195506 A1    Sep. 8, 2005

Related U.S. Application Data

(60) Provisional application No. 60/561,983, filed on Apr. 14, 2004, provisional application No. 60/550,714, filed on Mar. 5, 2004.

(51) Int. Cl.
*G02B 5/10* (2006.01)

(52) U.S. Cl. ................................ 359/858; 359/861

(58) Field of Classification Search ............. 359/857, 359/858, 861, 867, 851, 853
See application file for complete search history.

(56) References Cited

U.S. PATENT DOCUMENTS

| | | | | |
|---|---|---|---|---|
| 2,759,106 | A | | 8/1956 | Wolter |
| 2,766,385 | A | * | 10/1956 | Herrnring et al. ............. 378/70 |
| 2,819,404 | A | * | 1/1958 | Herrnring et al. ............. 378/43 |
| 3,775,611 | A | | 11/1973 | Borovsky et al. |
| 3,821,556 | A | | 6/1974 | Hoover |
| 4,941,147 | A | * | 7/1990 | Bhowmik .................... 372/94 |
| 5,604,782 | A | | 2/1997 | Cash, Jr. |
| 6,049,588 | A | | 4/2000 | Cash, Jr. |
| 6,195,201 | B1 | | 2/2001 | Koch et al. |
| 6,570,168 | B1 | | 5/2003 | Schultz et al. |
| 2003/0053588 | A1 | | 3/2003 | Kondo et al. |
| 2003/0194054 | A1 | | 10/2003 | Ziock et al. |
| 2004/0065817 | A1 | | 4/2004 | Singer et al. |

FOREIGN PATENT DOCUMENTS

WO    WO 02/065482    8/2002

OTHER PUBLICATIONS

Partlo, et al., *Development of an EUV (13.5 nm) light source employing a Dense Plasma Focus in Lithium vapor*, Sematech 3rd Annual International Forum on Semiconductor Technology, Apr. 3-5, 2000, pp. 136-156.

(Continued)

*Primary Examiner*—Ricky D Shafer
(74) *Attorney, Agent, or Firm*—Knobbe, Martens, Olson & Bear, LLP

(57) ABSTRACT

Optical relays having three or more reflector portions to allow efficient grazing angle reflections with a relatively high acceptance of light are described. Light collected by the relay can be delivered to a selected location for various applications, including semiconductor lithography. In some embodiments, the grazing angles are selected to utilize the high reflectivity of extreme ultraviolet light at low grazing angles. The three or more reflectors can be arranged with respect to a light source to provide such grazing angle reflections and high acceptance. Some collectors can have more than one shell to increase the acceptance. In some embodiments, some of the reflectors can be configured to shape the delivered light.

30 Claims, 23 Drawing Sheets

OTHER PUBLICATIONS

Singh, et al., *Improved Theoretical Reflectivities of extreme Ultraviolet Mirrors*, Emerging Lithographic Technologies IV, Proceedings of SPIE, vol. 3997 (2000), pp. 412-419.
Brueggemann, *Conic Mirrors*, Focal Press, 1968, pp. 106-108.
Handbook of Optics, vol. 3, pp. 28.7-28.10.
Fomenkov, et al., NGL Workshop 2001, Dense Plasma Focus as a Light Source for Production EUV Lithography, in 35 pages.
Crowther, et al., *A Fly's Eye Condenser System for Uniform Illumination*, International Optical Design Conference 2002, Proceedings of SPIE, vol. 4832 (2002), pp. 302-310.

* cited by examiner

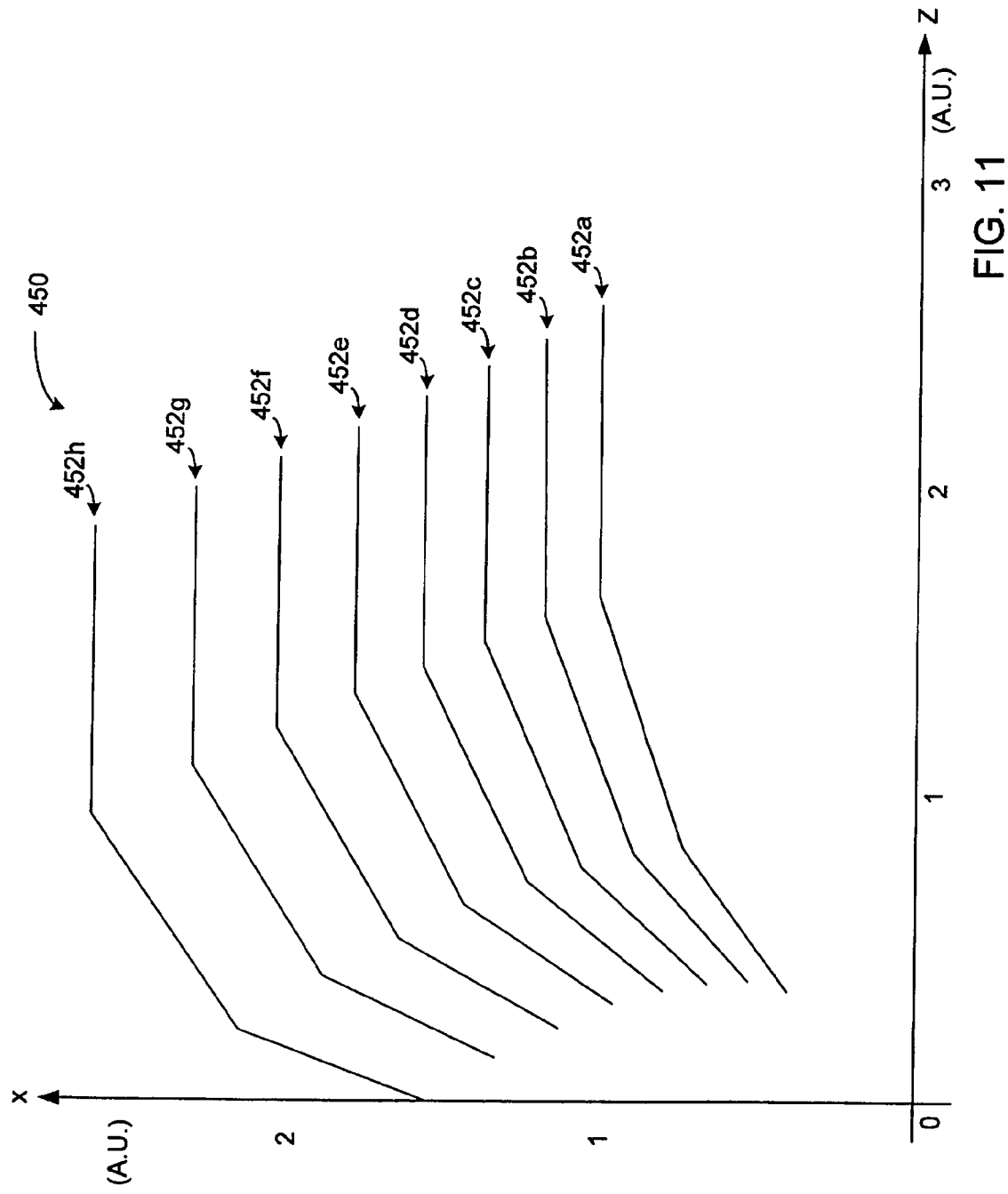

GRAZING INCIDENCE RELAYS

RELATED APPLICATIONS

This application claims the benefit of U.S. Provisional Application No. 60/561,983 filed on Apr. 14, 2004, titled "HIGH NUMERIC APERTURE GRAZING INCIDENCE RELAYS" and U.S. Provisional Application No. 60/550,714 filed on Mar. 5, 2004, titled "LARGE SOLID ANGLE EUV COLLECTORS," which are both hereby incorporated herein by reference in its entirety.

BACKGROUND

1. Field

The present teachings generally relate to grazing incidence reflectors such as grazing incidence reflectors having relatively high numeric apertures for UV and x-ray light.

2. Description of the Related Art

In many optics applications, it is desirable to collect and deliver UV or x-ray light from a source to a selected location. Semiconductor fabrication, for example, is one application where UV light can be used, for example, in processes such as lithography. Some types of light used in semiconductor photolithography include 193 nm, 157 nm, and 13.4 nm (extreme ultraviolet, EUV, or x-ray) electromagnetic radiations. Light in the EUV regime appears to have promising lithographic applications.

One problem with EUV light as a lithographic tool is that typical EUV sources do not provide sufficient power output for efficient lithography processing. For example, a common EUV source provides less than approximately 10 watts. Such a source by itself cannot provide sufficient power to process wafers efficiently, if possible at all. In some wafer fabrication applications, it is estimated that about 100 watts of EUV power is needed to process about 120 wafers per hour to be cost effective. Thus, one can see why the lack of source power is considered to be one of the significant obstacles to the adoption of EUV lithography.

There is a need, therefore, for improvements in delivering sufficient light to a selected location for various applications. In one example, there is a need for delivering light in the EUV regime with sufficient power to facilitate efficient semiconductor fabrication processes such as lithography.

SUMMARY

One embodiment of the invention comprises a grazing incidence reflector comprising a first grazing incidence reflector portion, a second grazing incidence reflector portion, and a third grazing incidence reflector portion. The first, second, and third grazing incidence reflector portions have different curvatures and are positioned with respect to each other such that light rays reflect from the first, second, and third portions at grazing angles.

Another embodiment of the invention comprises a grazing incidence reflector comprising an elliptically shaped grazing incidence reflector portion and a plurality of hyperbolically shaped grazing incidence reflector portions.

Another embodiment of the invention comprises a grazing incidence reflector comprising a first grazing incidence reflector portion, a second grazing incidence reflector portion, and a third grazing incidence reflector portion wherein the third grazing incidence reflector portion has negative power.

Another embodiment of the invention comprises a method of fabricating a grazing incidence reflector. In this method, a first grazing incidence reflector portion is positioned with respect to a second grazing incidence reflector portion such that light rays reflect from the first portion to the second portion at grazing angles. A third grazing incidence reflector portion is positioned with respect to the second grazing incidence reflector portion such that light rays reflect from the second to the third portion at grazing angles. The first, second, and third grazing incidence reflector portions have different curvatures.

Another embodiment of the invention comprises a method of fabricating a grazing incidence reflector comprising positioning a plurality of substantially hyperbolically shaped grazing incidence reflector portions with respect to a substantially elliptically shaped grazing incidence reflector portion such that light rays reflect from the grazing incidence reflector portions at grazing angles.

Another embodiment of the invention comprises a grazing incidence reflector comprising means for reflecting a ray of light at a first grazing incidence angle, means for reflecting the ray of light at a second grazing incidence angle, and means for reflecting the ray of light at a third grazing incidence angle. The first, second, and third angles are different.

Another embodiment of the invention comprises an optical system comprising a light source and collector. The collector comprises a first grazing incidence reflector portion, a second grazing incidence reflector portion, and a third grazing incidence reflector portion. The first, second, and third grazing incidence reflector portions have different curvatures and are positioned with respect to each other such that light rays from the light source reflect from the first, second, and third portions at grazing angles.

Another embodiment of the invention comprises a grazing incidence relay comprising only three relay stations. The three relay stations comprise first, second, and third grazing incidence reflector portions, respectively. The relay stations are disposed with respect to each other such that light rays reflect at grazing incidence from the first grazing incidence reflector portion, to the second grazing incidence reflector portion, and onto the third grazing incidence reflector portion.

Another embodiment of the invention comprises a method of fabricating a relay comprising only three relay stations. The method comprises locating first and second grazing incidence reflector portions such that light reflected at grazing incidence from the first grazing incidence reflector portion is reflected at grazing incidence from the second grazing incidence reflector portion. The method further comprises locating a third grazing incidence reflector portion with respect to the second grazing incidence reflector portion such that the light reflected at grazing incidence from the second grazing incidence reflector portion is reflected at grazing incidence to the third grazing incidence reflector portion. The first, second, and third grazing incidence reflector portions comprise the only three reflector stations.

Another embodiment of the invention comprises a method of relaying light from an object location to an image location with only three relay stations. The method comprises reflecting light from the object location at grazing incidence off a first reflecting surface to a second reflecting surface. The method further comprises reflecting the light at grazing incidence off the second reflecting surface to a third reflecting surface and reflecting the light at grazing incidence off the third reflecting surface to the image location. The first, second, and third reflecting surfaces comprise the only three relay stations.

Another embodiment of the invention comprises a grazing incidence reflector comprising a first grazing incidence reflector portion, a second grazing incidence reflector portion, and a third grazing incidence reflector portion. The first and third grazing incidence reflector portions are disposed symmetrically about the second grazing incidence reflector portion such that light rays reflect from the first reflector portion to the second reflector portion and to the third reflector portion at grazing angles. The second grazing incidence reflector portion is different than the first and third grazing incidence reflector portions. In some embodiments, the second grazing incidence reflector portion may have a different shape than the first and third grazing incidence reflector portions.

Another embodiment of the invention comprises a method of fabricating a grazing incidence reflector. In this method, a first grazing incidence reflector portion is positioned with respect to a second grazing incidence reflector portion such that light rays reflect from the first portion to the second portions at grazing angles. A third grazing incidence reflector portion is positioned with respect to the second grazing incidence reflector portion such that light rays reflect from the second to the third portion at grazing angles. The first and third grazing incidence reflector portions are positioned symmetrically about an axis of symmetry that passes through the second grazing incidence reflector portion. The second grazing incidence reflector portion is different than the first and third grazing incidence reflector portions.

Another embodiment of the invention comprises a method of fabricating a grazing incidence reflector comprises positioning a first grazing incidence reflector portion with respect to a second grazing incidence reflector portion such that light rays reflect from the first positive power grazing incidence reflector portion to the second negative power grazing incidence reflector portion. The method further comprises positioning a third power grazing incidence reflector portion with respect to a second grazing incidence reflector portion such that light rays reflect from the at second grazing incidence reflector portion to the third grazing incidence reflector portion. At least one of the first, second, and third grazing incidence reflector portions has positive power and at least one of the first, second, and third grazing incidence reflector portions has negative power.

BRIEF DESCRIPTION OF THE DRAWINGS

FIG. 11 shows one embodiment of an exemplary high numeric aperture relay having eight nested shells each comprising three-reflection assemblies;

These and other aspects, advantages, and novel features of the present teachings will become apparent upon reading the following detailed description and upon reference to the accompanying drawings. In the drawings, similar elements have similar reference numerals.

DETAILED DESCRIPTION OF SOME EMBODIMENTS

Various embodiments described below include, but are not limited to, systems and methods having relatively high reflection efficiency and high numeric apertures. Devices having such properties can be achieved by multiple reflections from multiple surfaces, where each reflection is at a relatively shallow grazing angle. Each reflecting surface can be configured (e.g., shaped and positioned) to improve the reflectivity by providing grazing angles of incidence and reflection. As described herein, use of multiple reflections from differently shaped surfaces allows greater flexibility in the design of devices that use shallow grazing angle reflections.

Figure 1:
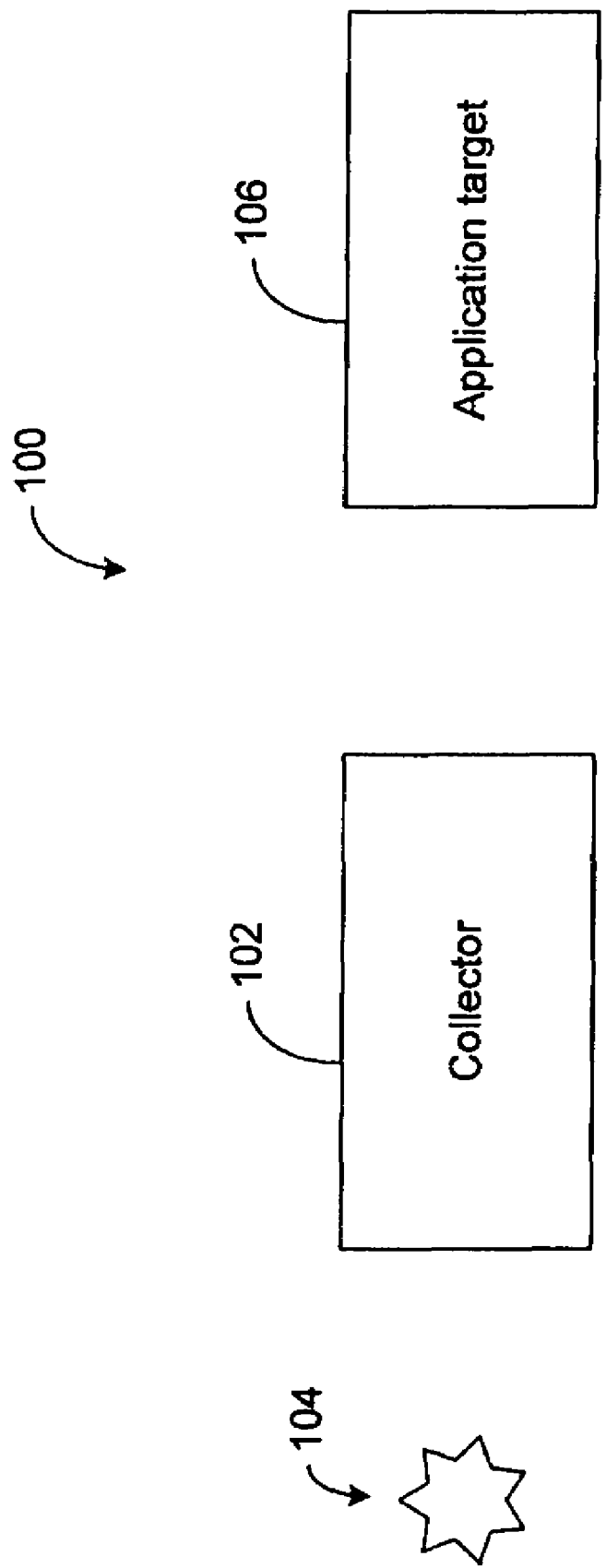
FIG. 1 shows a block diagram of one embodiment of a relay that collects light from a source and relays it to a target.

FIG. 1 shows a block diagram of a typical application 100, where light from a source 104 is delivered to an application target 106 via a collector 102 that provides multiple reflections at grazing angles. One can readily see that a high numeric aperture of the collector is desirable in many applications, since it can deliver larger amount of the source's light to the target.

For the purpose of description herein, it will be understood that the term "light" includes, but is not limited, to electromagnetic radiation in the ultraviolet (e.g., EUV) range. The concepts of the present teachings are applicable to any part of the electromagnetic spectrum that can be reflected. Thus, the term "light" may include but is not limited to visible, infrared, ultraviolet, x-ray, or gamma radiation.

Figure 2A:
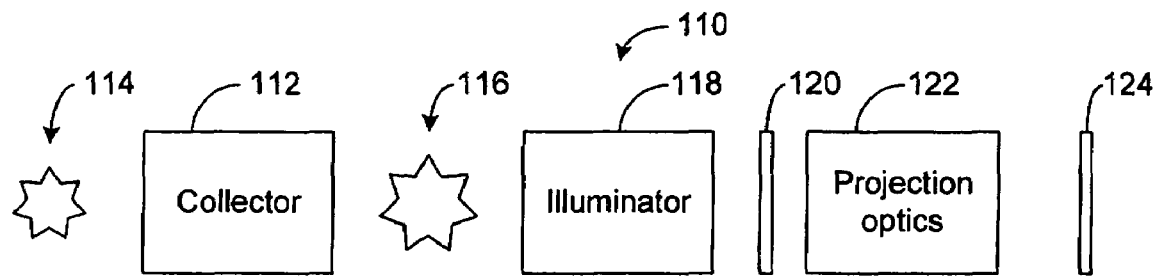
FIGS. 2A-C show by example configurations of some possible applications of relays.
Figure 2B:
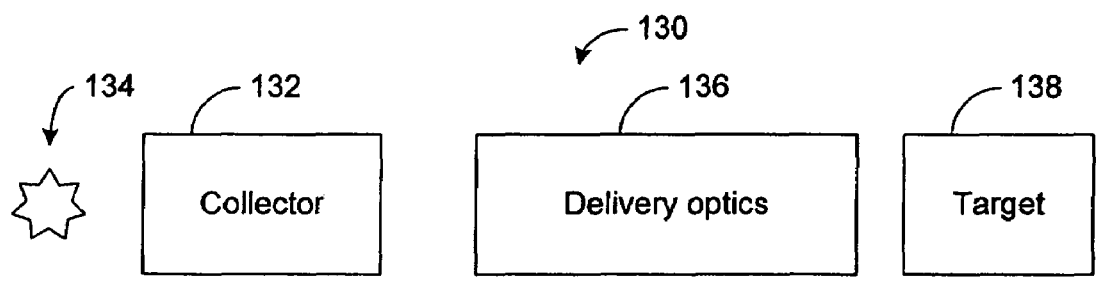
Figure 2C:
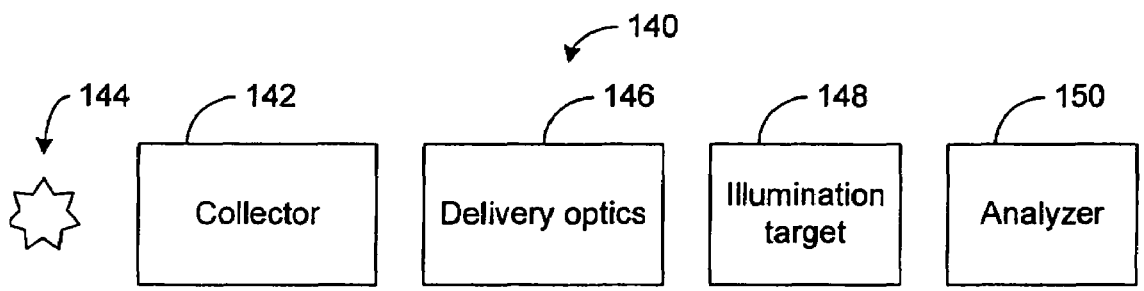

FIGS. 2A-C now show some examples of applications that can benefit from the high numeric aperture relay (also referred to herein as a collector). In one example application 110 as shown in FIG. 2A, a collector 112 collects light from a source 114 and forms an image 116. Light from the image 116 propagates into an illuminator 118 that provides illumination to a projection optics assembly 122 for application to a target 124. Lithography in semiconductor fabrication is an example of such an application. In lithography, a mask 120 can provide a selected pattern of illumination to the projection optics assembly 122, and the resulting pattern can be applied to a wafer target.

FIG. 2B shows another example application 130, where a collector 132 collects and delivers light from a source 134 to a delivery optics assembly 136. The delivery optics assembly 136 in turn delivers the collected light to a target 138. Such configuration can be applied to numerous applications such as medical applications where imaging and/or treatment "light" (such as extreme ultraviolet, x-ray, or gamma-ray) can be delivered to tissues more effectively. Because the collector 132 has a relatively high numeric aperture, it can collect a relatively large portion of the light from the source. Consequently, a less intense radiation source can be used for delivering a given intensity light at the target 138.

FIG. 2C shows another example application 140, where a collector 142 collects and delivers light from a source 144 to a delivery optics assembly 146. The delivery optics assembly 146 in turn delivers the collected light to an illumination target 148. The light delivered to the target 148 is then analyzed by an analyzer 150. Such configuration can be applied to numerous applications such as spectroscopy where a relatively faint light from a sample being analyzed (at the source location) can be collected with relatively high efficiency so as to facilitate an improved resolution in the analysis.

Numerical apertures greater than one are possible. (See for example discussion below regarding FIG. 13 wherein a reflector assembly is described that collects 73.2% of $4\pi$ steradians). Accordingly, greater than 70% of the $4\pi$ steradians may be collected by a reflector assembly. In other embodiments, 30%, 50%, or more of the $4\pi$ steradians may be collected by a reflector assembly. Values outside these ranges, however, are also possible.

Figure 3:
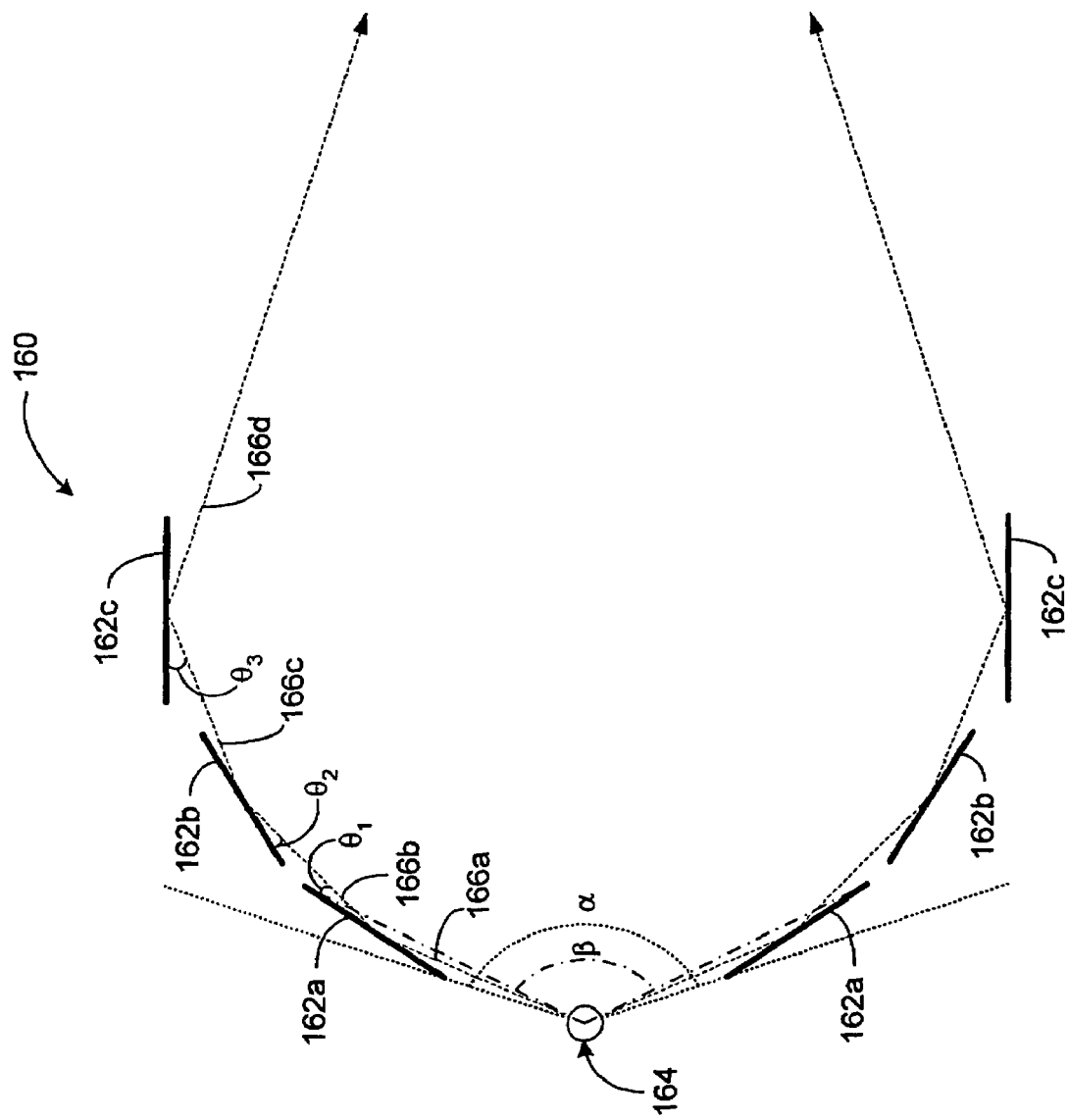
FIG. 3 shows one embodiment of a relay that achieves high numeric aperture by having three or more reflections from differently shaped reflective surfaces at relatively small grazing angles.

FIG. 3 now shows a side cutaway view of a portion of one embodiment of a collector assembly 160 to demonstrate how a relatively large acceptance (angle $\alpha$) can be achieved for light being emitted from a source 164. The example assembly 160 includes three example sets of reflector portions 162a-c arranged to provide relatively small ("shallow") grazing angle reflections. The collector assembly 160 may be considered a relay that relays light from an object to an image. The reflector portions may be referred to as stations where light is reflected at grazing incidence. Light is transferred sequentially from one station to the next station in the relay. As shown, the reflector portions 162a-c are separated. In other embodiments, the reflector portions 162a-c may be connected but may form different sections of a single reflector. The term reflector portions is used herein both to include separate reflector surfaces or reflector elements that form part of a reflector or reflector assembly as well as different sections integrated together in a single reflecting member.

The terms grazing angle incidence or grazing incidence as well as grazing angle reflection refer to reflection from a reflecting surface of a reflector wherein the component of light parallel to an optical axis through the reflector is not reversed upon reflection. Accordingly, light incident on the reflecting surface and light reflected from the reflecting surface each have vector components parallel to the optical axis that are in the same direction. In contrast, with normal incidence reflection, the component parallel to the optical axis is reversed upon reflection such that light incident on the reflecting surface and light reflected from the reflecting surface have vector components parallel to the optical axis that are directed in opposite directions.

An example ray 166a is shown to originate from the source 164, and reflect from the first reflector 162a into a first reflected ray 166b at a grazing angle of $\theta_1$. The first reflected ray 166b then reflects from the second reflector 162b into a second reflected ray 166c at a grazing angle of $\theta_2$. Similarly, the second reflected ray 166c then reflects from the third reflector 162c into a third reflected ray 166d at a grazing angle $\theta_3$.

From FIG. 3, one can see that in one embodiment, an example maximum acceptance angle $\alpha$ can be defined as the angle subtended by the proximal edge of the first reflector 162a with respect to the source 164. One can also see that for the shown example assembly 160, the minimum value of the acceptance angle can be defined as the angle subtended by the distal edge of the first reflector 162a with respect to the source 164 (angle $\beta$). In some embodiments, as described herein, collection of light directed to angles less than that of $\beta$ of the example assembly 160 can be achieved by one or more assemblies of collectors that may or may not be similar to that of the assembly 160. These additional assemblies are referred to herein as "shells." If the collection angle is still relatively large (e.g., comparable to $\beta$), then another similar "shell" of reflectors can capture the next range of angles of light. If the collection angle is relatively small, then shallow grazing angle reflectors may not be needed, and other collectors may be used.

Thus, one can see that use of multiple reflector portions allows re-directing of collected rays with relatively shallow grazing reflection angles. In one example application where a ruthenium EUV coating is used, it is preferable to keep the grazing angle less than approximately 20 degrees at each reflector portion to stay in the "high reflectance" regime. In one embodiment, the reflector portions are arranged so that their average grazing angles are substantially similar. In some embodiment, the reflector portions are arranged so that their maximum grazing angles are substantially similar.

Figure 4:
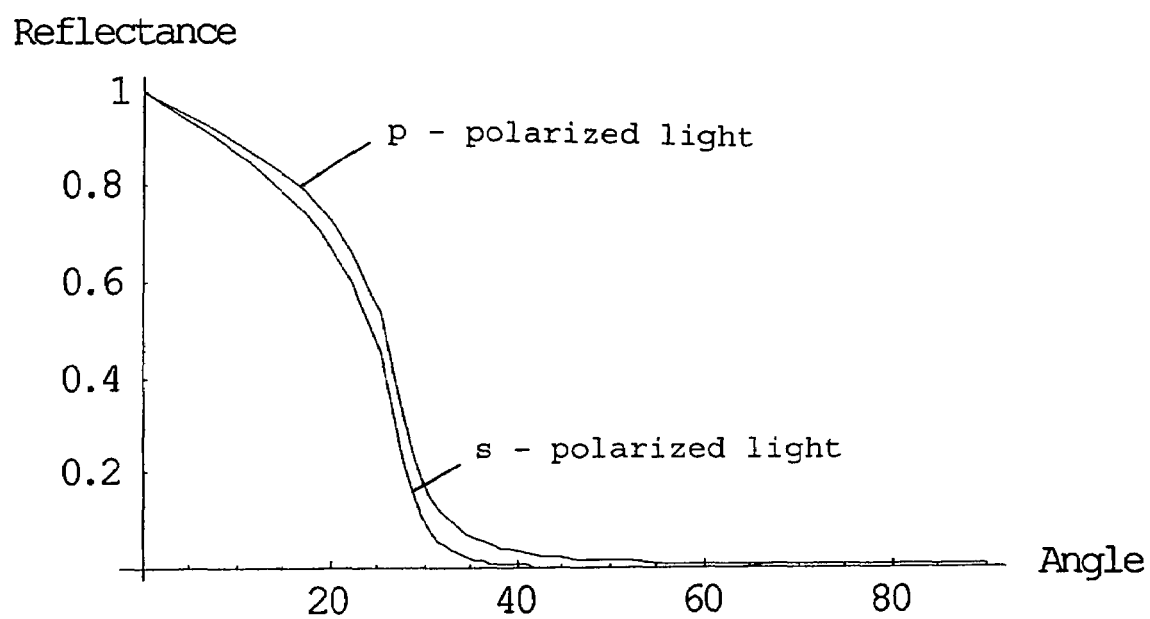
FIG. 4 shows an example reflectivity curve for an example reflective surface, showing that in some applications such as extreme ultraviolet (EUV) application, reflectivity is relatively high at low values of grazing angles.

FIG. 4 shows example reflectance curves for s- and p-polarized light as a function of grazing angle (zero degree is equivalent to being parallel to the reflecting surface at the reflection point) for an example ruthenium coated reflector. For both polarized light, one can see that the reflectance is relatively high when the grazing angle is less than approximately 20 degrees.

Reflectance information such as that of FIG. 4 can be utilized to help design the various collectors described herein.

Such reflectance information corresponding to a given reflection set of parameters, such as material (layer type and composition), optical property, and the like, can be determined by any known methods, including a software driven application available to the public at the website http://www-cxro.lbl.gov/optical_constants.

Figure 5:
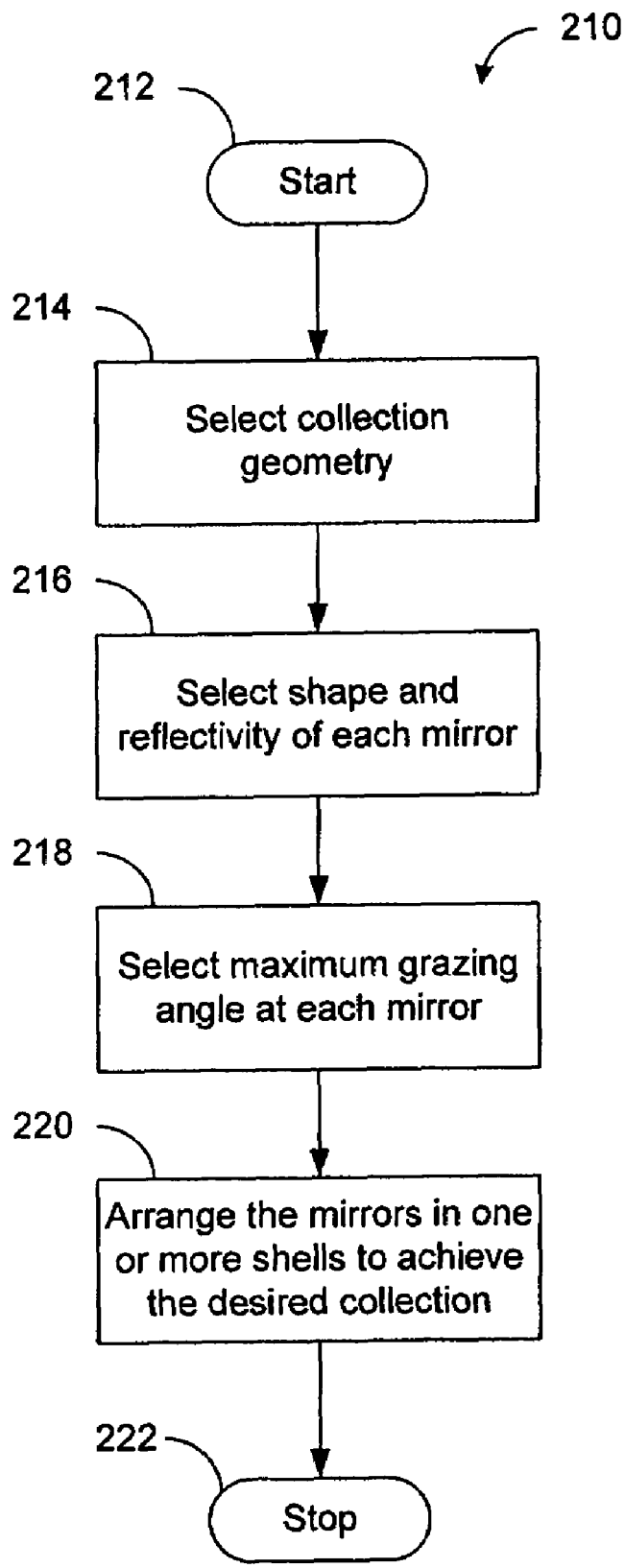
FIG. 5 shows by example one possible way of designing a relay.

FIG. 5 now shows an example process 210 that can be used to design a collector having a relatively large numeric aperture. The process 210 begins in a start state 212, and in a process block 214, the process 210 selects collection geometry for a desired collection performance. In a process block 216, the process 210 selects the shape and reflectivity of each reflector portion of such a collector. In a process block 218, the process 210 selects a maximum grazing angle for each reflector portion. In a process block 220, the process 210 arranges the reflecting portions in one or more shells to achieve the desired collection configuration. The process ends in a stop state 222. This example process 210 may be varied. For example, steps may be added, subtracted, combined, separated, or otherwise varied. The order of the steps may also be changed.

Accordingly, a wide range of design methods are possible. In certain embodiments, optical simulations such as ray tracing may be used to facilitate design. Different parameters may be varied and one or more figures of merit may be employed, for example, in design and optimization procedures. Simulation software such as CODE V® and LightTools® may be employed. Other processes may be used.

As described herein by way of examples, a number of different collector configurations can be implemented. Some specific examples of high numeric aperture collectors are described hereinbelow.

Figure 6A:
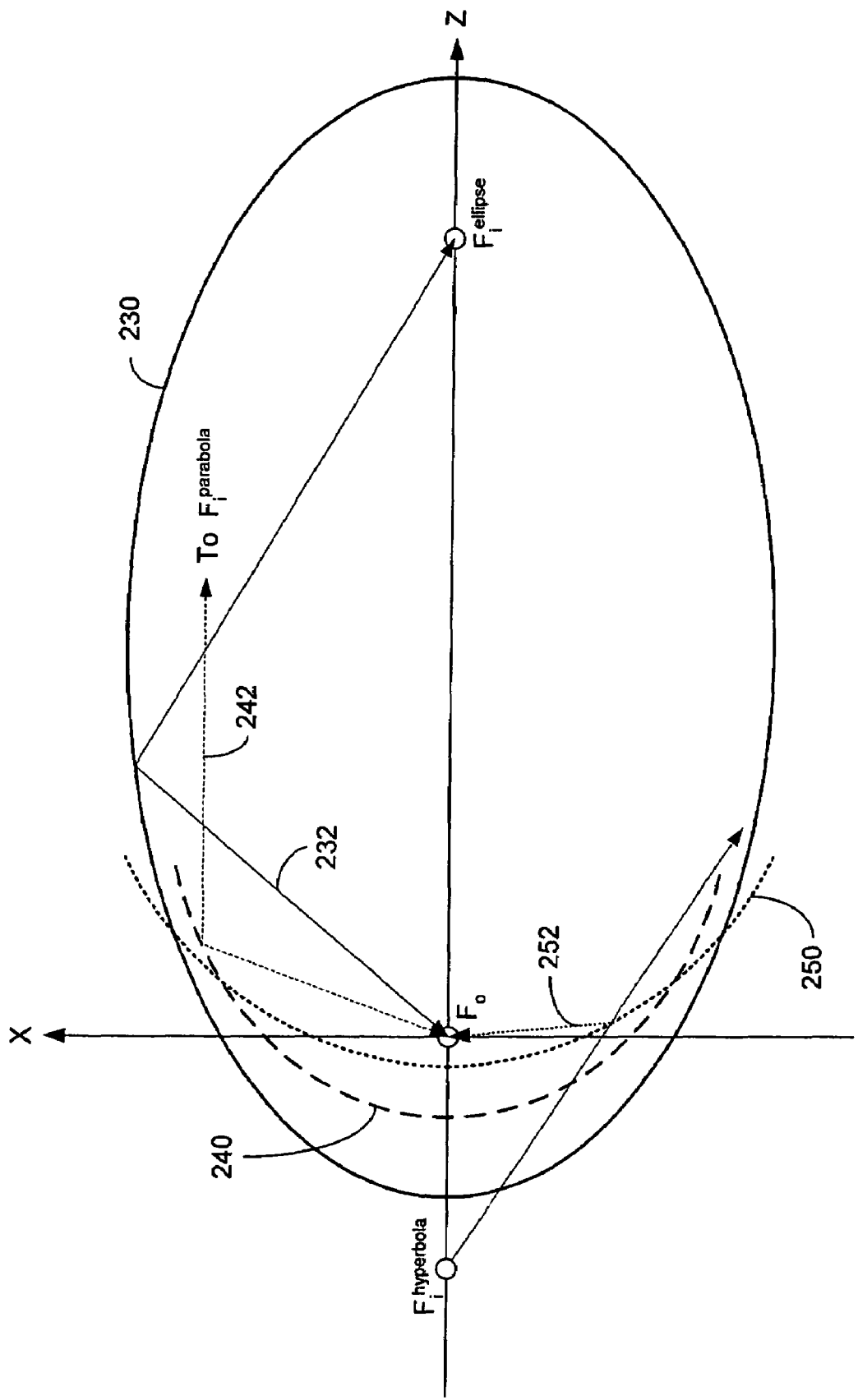
FIGS. 6A-B shows by example one way of characterizing reflective surfaces having various shapes such as an ellipse, a parabola, and a hyperbola.

In some embodiments, various reflecting elements that make up the high numeric aperture collectors are portions of curved surfaces having cross-sections that may be, for example, but are not limited to, conic sections. Examples of such conic sections include ellipses, parabolas, and hyperbolas. Such exemplary surfaces, are referred to herein as elliptical, parabolic, and hyperbolic, respectively. As will be discussed more fully below, in various preferred embodiments the reflecting surfaces are circularly symmetrical about the optical axis. The reflecting surface may, for example, be a portion of an ellipsoid, hyperboloid, or paraboloid. In other embodiments, the reflecting surface may be a cylindrical surface having a cross-section orthogonal to the optical axis that is a conic section such as, for example, an ellipse, a hyperbola, or a parabola. These various surfaces, therefore, have cross-sections shaped as an ellipse, hyperbola, and parabola. As described above, shapes other than elliptical, hyperbolic, and parabolic are possible. FIGS. 6A and B show one way of characterizing such exemplary curved reflecting surfaces. It will be understood that such characterization is for the purpose of description, and is not intended to limit the scope of the present teachings in any manner.

As shown in FIG. 6A, an example coordinate system (X,Y,Z) can be used to describe various conic section shapes. In the description herein, the Z-axis is chosen as the optical axis, and the X axis and Y axis (out of the paper) define the transverse plane. For the purpose of description, an object location $F_o$ is shown to be common for conic section shapes including ellipse 230, parabola 240, and hyperbola 250. Spherical and other aspheric shapes can also be employed. As will be described more fully below, the aspheric surfaces may be substantially elliptical, parabolic, or hyperbolic. These aspheres, however, may include an additional contribution of that alters the shape from perfectly elliptical, parabolic, or hyperbolic.

The object location $F_o$ is shown to be one of the two foci for the example ellipse 230. The other focus for the ellipse 230 is shown to be an image location $F_i^{ellipse}$ corresponding to the object location $F_o$. An example ray 232 shows how a ray of light originating from the object location $F_o$ reflects from an arbitrary location along the elliptical reflecting surface 230 and ends at the image location $F_i^{ellipse}$ (and vice versa).

The object location $F_o$ is also shown to be the focal point of the example parabola 240. An example ray 242 shows how a ray originating from the object location $F_o$ reflects from an arbitrary location along the parabolic reflecting surface 240 and is directed away from the parabola 240 at a direction substantially parallel to the optical axis so as to place the image at a distance substantially far from the object location $F_o$ (i.e., image location $F_i^{parabola}$ at infinity) (and vice versa).

The object location $F_o$ is shown to yield a virtual image location $F_i^{hyperbola}$ that is on the convex side of the example hyperbola 250. An example ray 252 shows how a ray originating from the object location $F_o$ reflects from an arbitrary location along the hyperbolic reflecting surface 250 and is reflected away from the optical axis such that extending that reflected ray to the convex side results in a line that intersects with the virtual image location $F_i^{hyperbola}$.

Figure 6B:
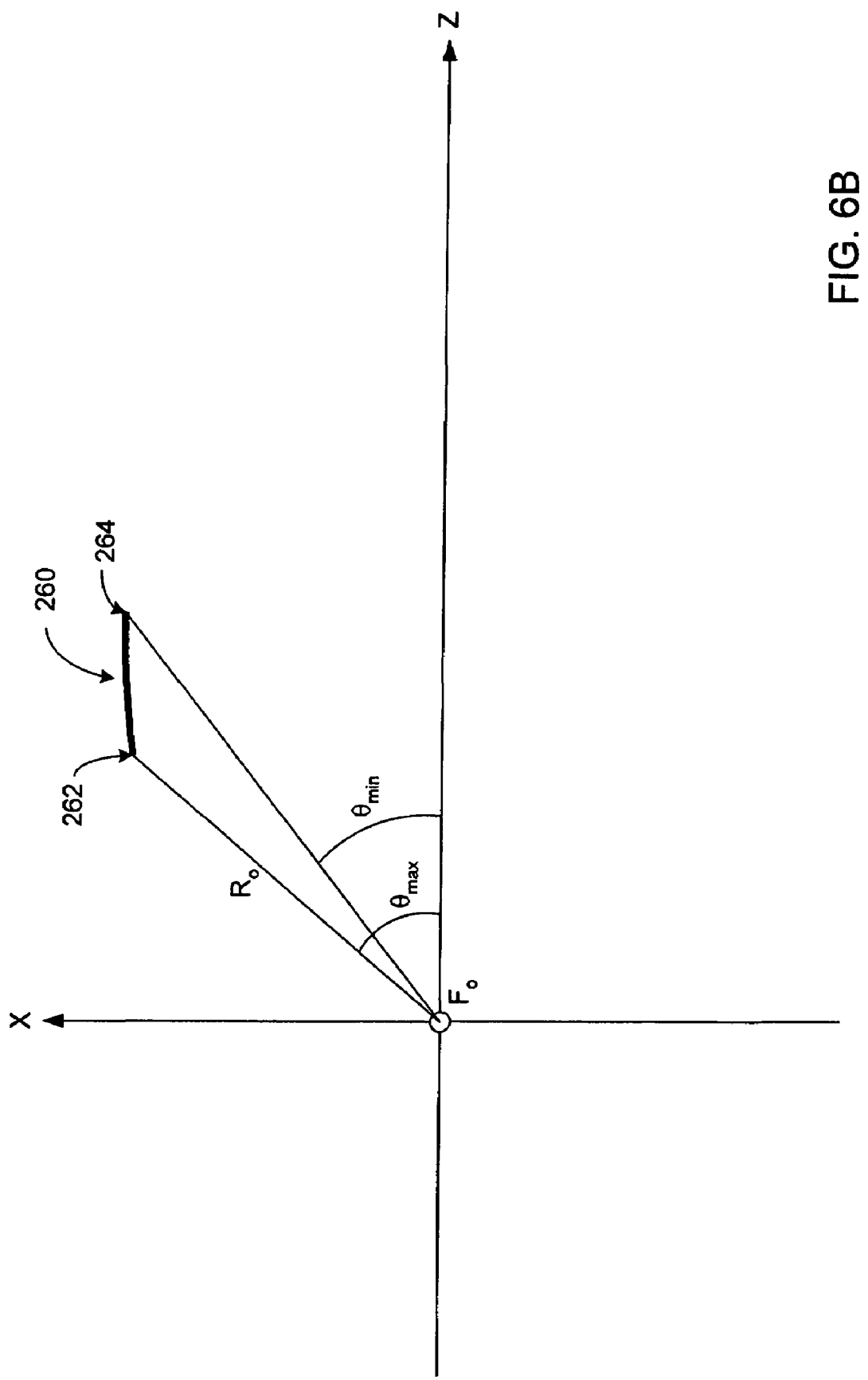

In some embodiments described herein, reflector portions can be made from sections of the foregoing example curved surfaces. For the purpose of description, the convention shown in FIG. 6B can be used. Again, such choice of convention is not to limit the scope of the present teachings in any manner.

A reflecting element 260 is shown to be positioned relative to the object location $F_o$ so as to define a proximal end 262 and a distal end 264. A line that extends from the object location $F_o$ to the distal end 264 defines an angle $\theta_{min}$ with respect to the Z axis. Similarly, a line that extends from the object location $F_o$ to the proximal end 262 defines an angle $\theta_{max}$ with respect to the Z axis. Furthermore, the distance between the object location $F_o$ and the proximal end 262 of the reflecting element 260 is denoted as $R_0$. In the description herein, the proximal end of a reflector portion is also referred as a leading edge, and the distal end is also referred as a trailing edge.

Figure 7A:
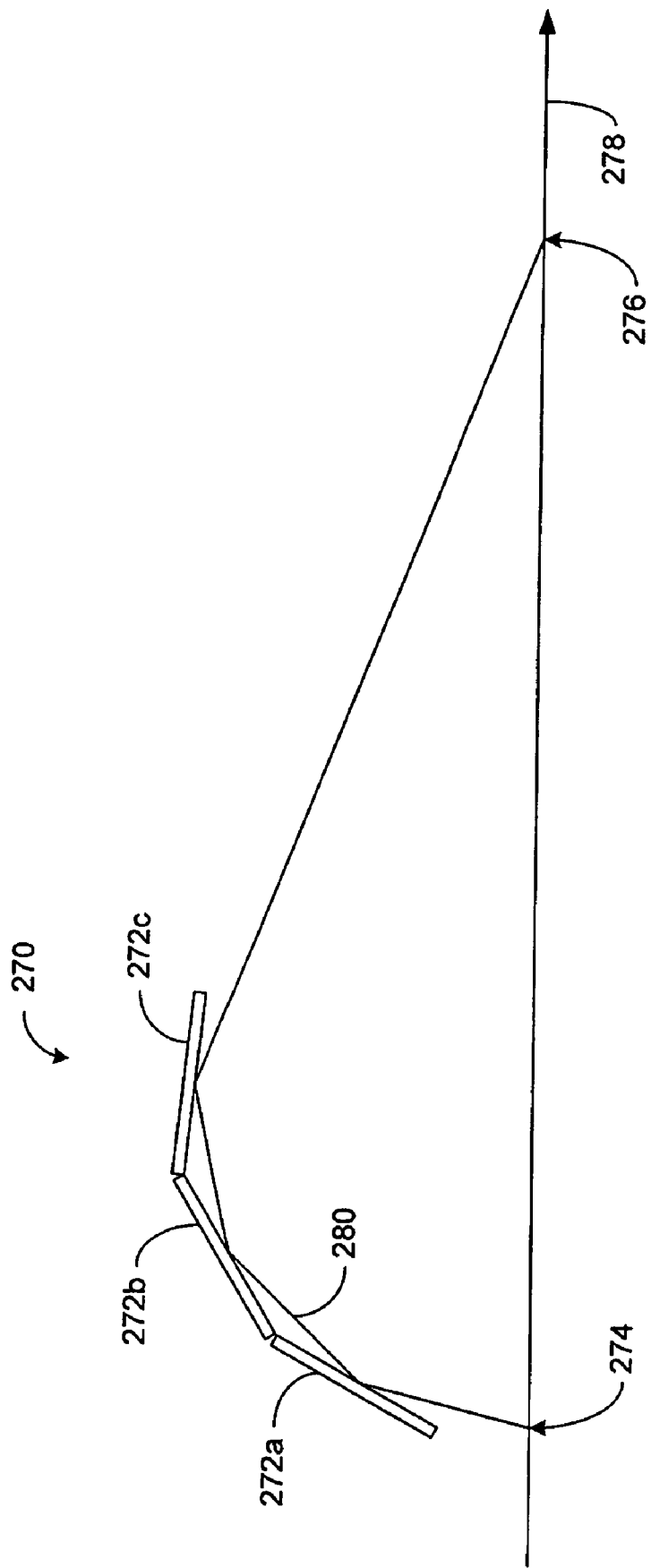
FIG. 7A shows one embodiment of one layer of a three-reflection assembly disposed adjacent an object location where a source can be located.

FIGS. 7A-D show some examples of how three or more reflecting portions (having characteristics described, e.g., in FIGS. 6A and B) can be arranged to form a shell-like structure that provides relatively high acceptance of light from a source. FIG. 7A shows one embodiment of a reflector assembly or reflector 270 having three reflector portions 272 (three stations) arranged with respect to a Z axis 278 (optical axis) so as to provide shallow grazing angle reflections at the reflector portions 272. Thus, a light ray 280 is shown to originate from a source location (object location $F_o$) 274 and reflect successively from the three reflectors 272a, b, and c. The light ray emerging from the reflector assembly 270 is directed to an image location $F_i$ 276.

The reflectors 272a-c can include different combinations of curved surfaces, including those described above in reference to FIG. 6A, depending on desired collection properties. For example, in one embodiment, the first and second reflector portions 272a and 272b are hyperbolic surfaces (e.g., a section of a hyperboloid surface or hyperbolic cylinder), and the third reflector 272c is an elliptical surface (e.g., a section of an ellipsoidal surface or elliptical cylinder). Such a combination can provide a relatively easily accessible intermediate focus 276. In one embodiment, the third reflector 272c is a parabolic surface (e.g., a section of a paraboloid surface or parabolic cylinder), and such a combination can be used to place the image 276 at a substantially distant location from the source 274. In one embodiment, the third reflector 272c is a section of a hyperbolic surface, and such a combination can be used if a virtual image is desired.

One can see that the first two reflector portions 272a and 272b can also be varied (i.e., other than hyperbolic). Thus, in other embodiments, the first and second reflector portions 272a and 272b include different combinations of hyperbolic, elliptical, and parabolic surfaces.

Figure 7B:
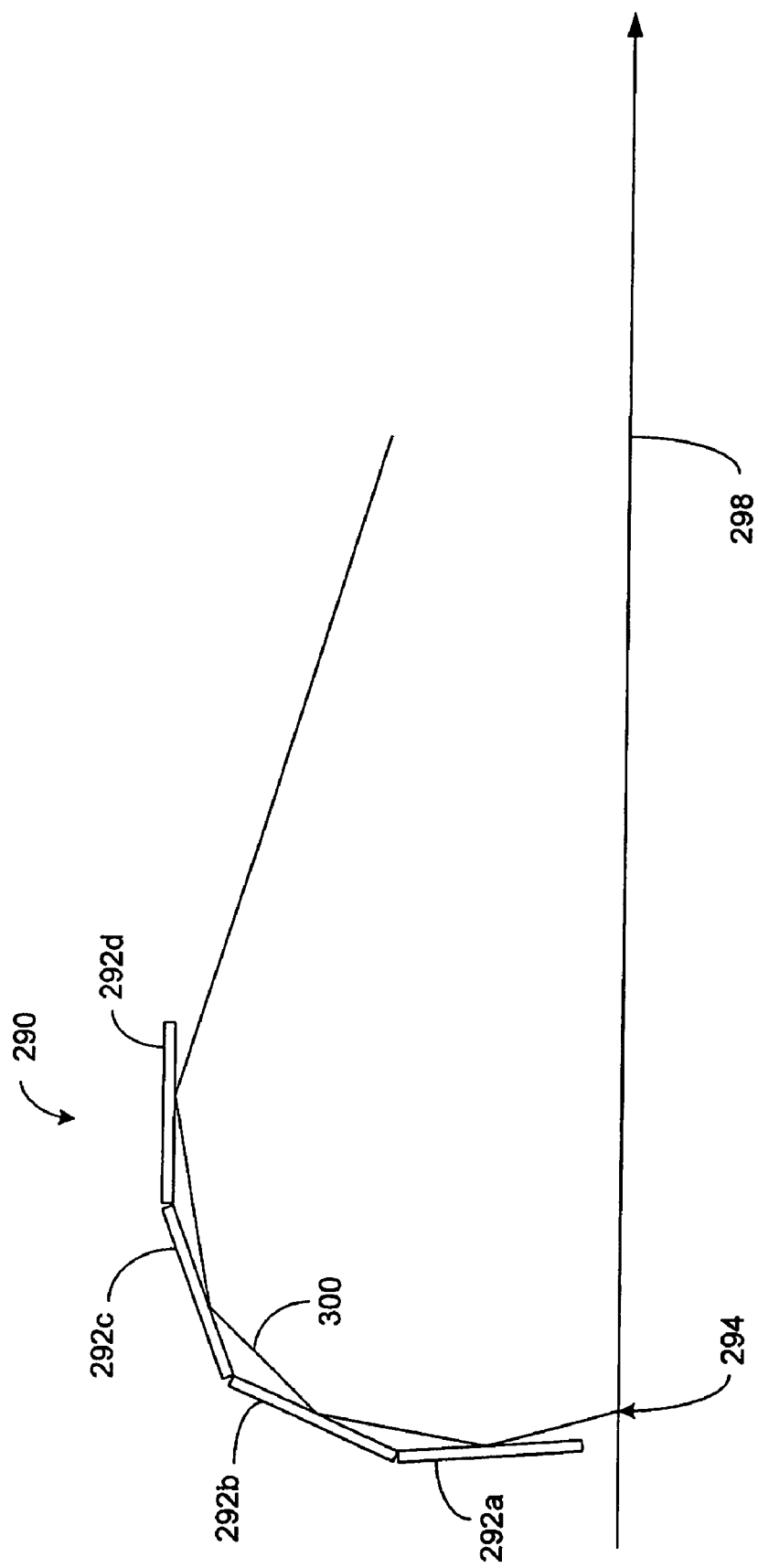
FIG. 7B shows one embodiment of one layer of a four-reflection assembly disposed adjacent the object location.

FIG. 7B shows one embodiment of a reflector assembly 290 having four reflector portions 292 (four stations) arranged with respect to a Z axis 298 so as to provide shallow grazing angle reflections at each of the reflector portions 292. Thus, a light ray 300 is shown to originate from a source location (object location $F_o$) 294 and reflect successively from the four reflector portions 292a, b, c, and d. The light ray emerging from the reflector assembly 290 is directed to an image location $F_i$ (not shown).

The reflector portions 292a-d can include different combinations of curved surfaces, including those described above in reference to FIG. 6A, depending on desired collection properties. For example, in one embodiment, the first, second and third reflector portions 292a, 292b, and 292c are hyperbolic surfaces, and the fourth reflector portion 292d is an elliptical surface. Such a combination can provide a relatively easily accessible intermediate focus. In one embodiment, the fourth reflector portion 292d is a parabolic surface, and such a combination can be used to place the image at a substantially distant location from the source 294. In one embodiment, the fourth reflector portion 292d is a hyperbolic surface, and such a combination can be used if a virtual image is desired.

One can see that the first three reflector portions 292a, 292b, and 292c can also be varied (i.e., other than hyperbolic surfaces). Thus, in other embodiments, the first, second, and third reflector portions 292a, 292b, and 292c include different combinations of hyperbolic, elliptical, and parabolic surfaces.

Figure 7C:
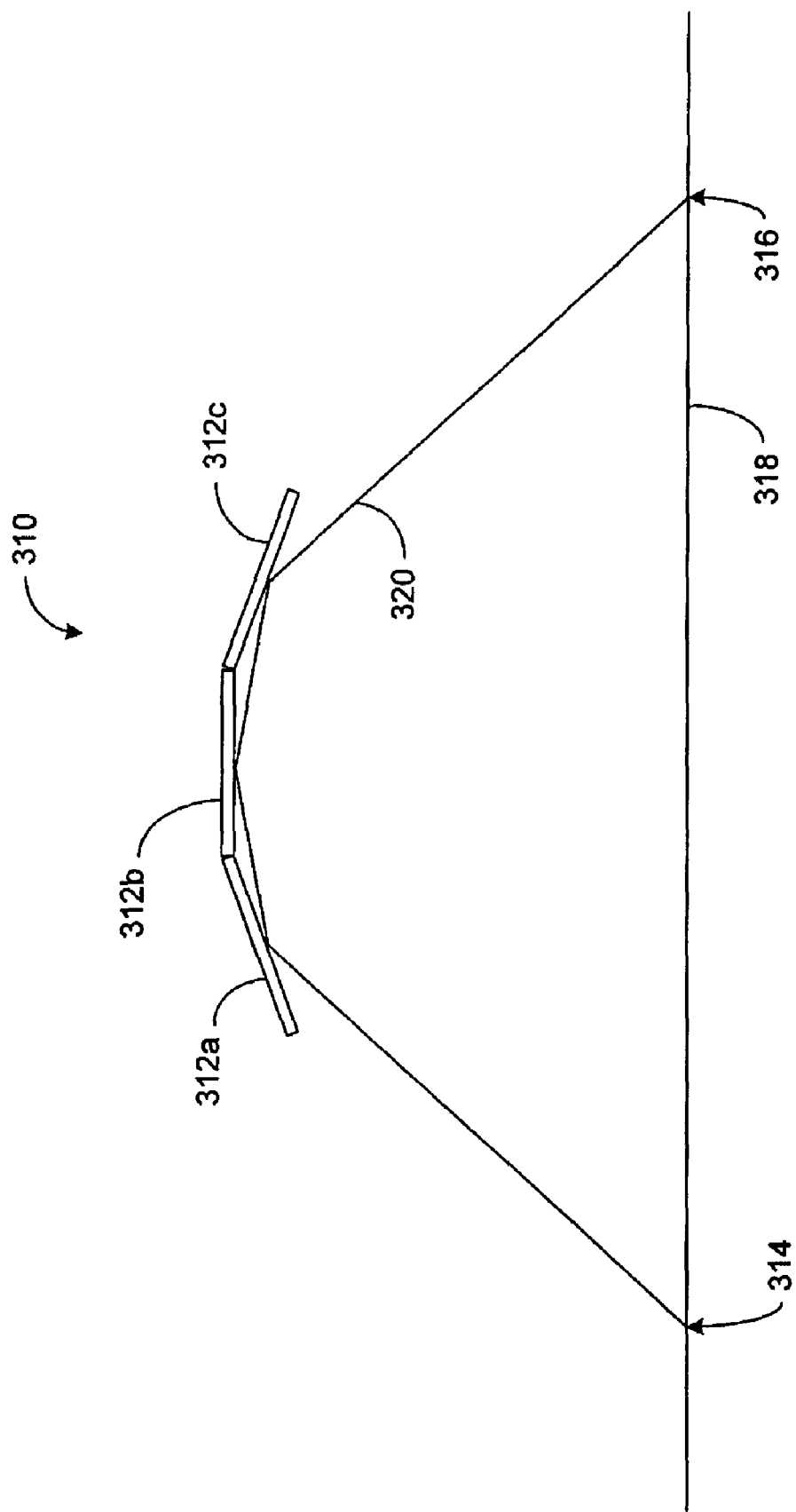
FIG. 7C shows one embodiment of one layer of a three-reflection assembly disposed generally between the object location and an image location where the reflected light can be delivered.

FIG. 7C shows one embodiment of a reflector assembly 310 having three reflector portions 312 (e.g., three stations) arranged with respect to a Z axis 318 (optical axis) so as to provide a reflective relay functionality via shallow grazing angle reflections. As shown, such shallow grazing angle reflections occur at the reflectors 312 for a light ray 320 that originates from a source location (object location $F_o$) 314. After successive reflections from the reflector portions 312, the light ray 320 emerges from the reflector assembly 310 and is directed to an image location $F_i$ 316.

In one embodiment, the reflector assembly 310 is substantially symmetric with respect to the object location 314 and the image location 316, and with respect to the relay function therebetween. Such substantial symmetry is not a requirement of the present teachings, and other embodiments may include asymmetric designs.

In one embodiment where the reflector assembly 310 is substantially symmetrical, the first and third reflector portions 312a and 312c are substantially similar hyperbolic surfaces, and the second reflector portion 312b is an elliptical surface. Again, such symmetry can provide advantageous reversibility, but is not a requirement.

One can see that the first and third reflector portions 312a and 312c can be varied (i.e., other than hyperbolic surfaces). Furthermore, the second reflector portion 312b can also be varied (i.e., other than an elliptical surface).

Figure 7D:
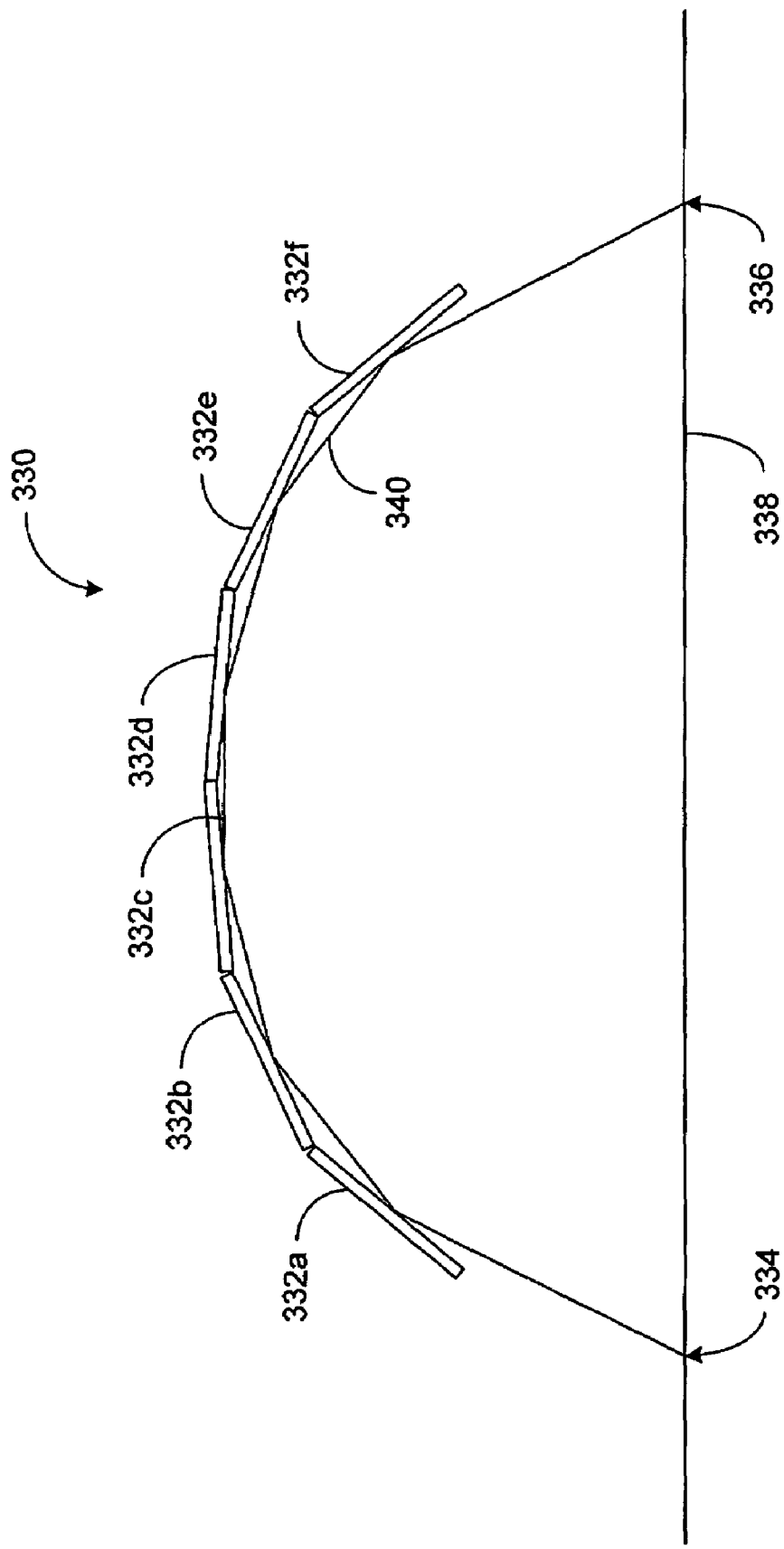
FIG. 7D shows one embodiment of a six-reflection assembly disposed generally between the object location and the image location.

FIG. 7D shows that reflective relays can have more than three reflector portions (such as that described above in reference to FIG. 7C). Furthermore, for symmetric relays, FIGS. 7C and D show that the number of reflector portions or elements can be either odd or even. For even number of reflector portions (in symmetric relays), two "center" reflector portions flank the mid-point between the object and the image.

As shown in FIG. 7D, one embodiment of a reflector assembly 330 includes six reflector portions 332 (six stations) arranged in a substantially symmetric manner with respect to object and image locations 334 and 336 defined on a Z axis 338 (optical axis). A light ray 340 originating from the object location 334 undergoes successive shallow grazing angle reflections from the six reflector portions 332 and is directed towards the image location 336.

In one embodiment, the two "center" reflector portions (third and fourth reflector portions 332c and 332d) are substantially similar parabolic surfaces. The second and fifth reflector portions 332b and 332e are substantially similar hyperbolic surfaces. The first and sixth reflector portions 332a and 332f are substantially similar hyperbolic surfaces.

One can see that the first and sixth reflector portions 332a and 332f can be varied (i.e., other than hyperbolic surfaces). Furthermore, the second and fifth reflector portions 332b and 332e can also be varied (i.e., other than hyperbolic surfaces). Furthermore, the third and fourth reflector portions 332c and 332d can also be varied (i.e., other than parabolic surfaces). Again, the symmetry feature provides advantageous reversibility, but is not a requirement.

Figure 8:
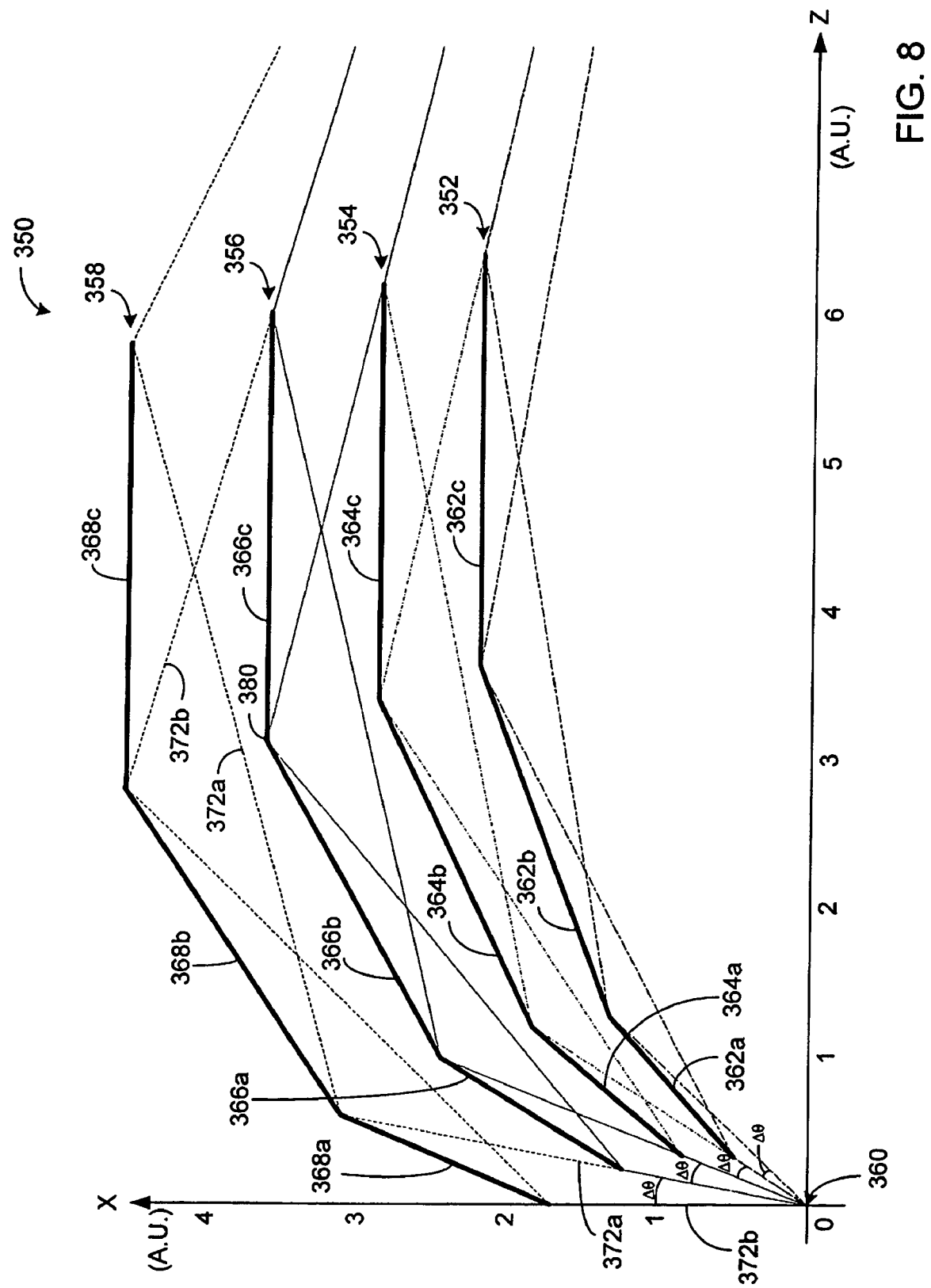
FIG. 8 shows one embodiment of an exemplary high numeric aperture relay having four nested shells each comprising a three-reflection assemblies, where input ends of the shells can be dimensioned and positioned to have a substantially similar angular acceptance.
Figure 9:
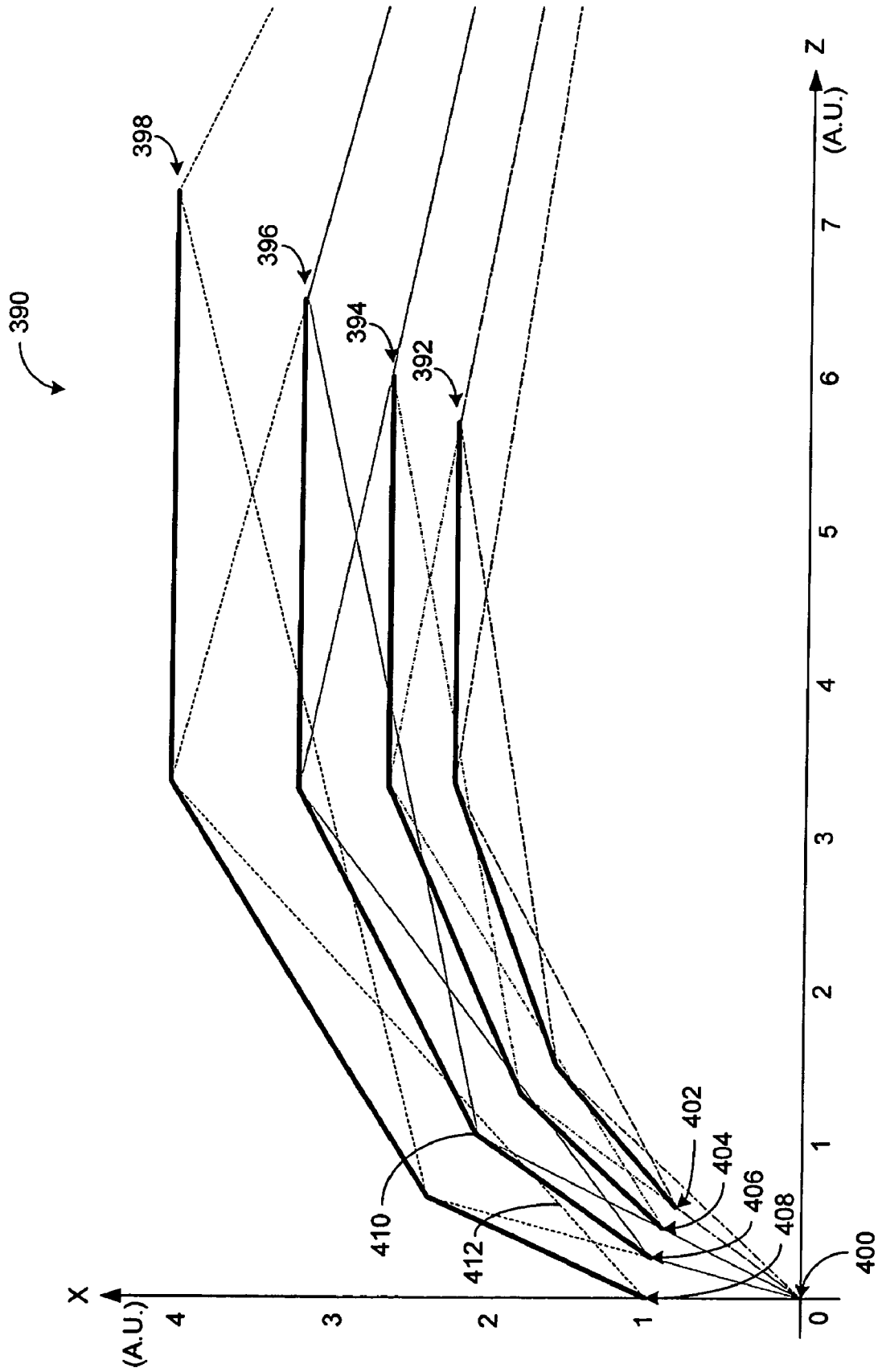
FIG. 9 shows one embodiment of an exemplary high numeric aperture relay having four nested shells each comprising three-reflection assemblies, where input ends of the shells can be dimensioned and positioned to be substantially equi-distant from the object location.

As described above in reference to FIGS. 7A-D, a shell comprising a plurality of reflector portions can be arranged in a number of ways. FIGS. 8-10 now show various embodiments of light collector assemblies having a plurality of such shells. Collectors having such shells can provide a greater range of angles of light being accepted or collected.

FIG. 8 shows one exemplary embodiment of a collector 350 having four shells, with each shell having three reflector portions (or three stations). In this particular example, the collector 350 includes shells 352, 354, 356, and 358. The first shell 352 includes reflector portions 362a, b, and c. Similarly, the second shell 354 includes reflector portions 364a, b, and c. Similarly, the third shell 356 includes reflector portions 366a, b, and c. Similarly, the fourth shell 358 includes reflector portions 368a, b, and c.

In the particular example embodiment 350 of FIG. 8, each of the first reflector portions (362a, 364a, 366a, 368a) of the four shells (352, 354, 356, 358) provides an range of angles of acceptance of approximately $\Delta\theta$ ($\theta_{max}-\theta_{min}$ in FIG. 6). For a given shell, the second and third reflector portions have dimensions and orientations that maintain the substantially common acceptance of $\Delta\theta$. Example light rays that define such acceptance boundaries are shown for each shell. For example, light rays corresponding to the fourth shell 358 are denoted as rays 372a and 372b.

In one embodiment of the collector 350 of FIG. 8, each of the four shells (352, 354, 356, 358) is formed by a hyperbolic-hyperbolic-elliptical configuration. And in one particular example design of such a configuration of the collector 350, the reflector portions are dimensioned and arranged in the manner as summarized in Table 1.

TABLE 1

|  | $R_{(\theta max)}$ | $\theta_{max}$ | $\theta_{min}$ | Foci separation |
|---|---|---|---|---|
| SHELL 4 | 1.7122 | 90. | 79. | −1.67867 |
|  | 3.8991 | 54. | 45.5668 | −9.58246 |
|  | 14.7856 | 18. | 14.8772 | 31.2611 |
| SHELL 3 | 1.25156 | 79. | 68. | −1.23675 |
|  | 3.30641 | 47.7076 | 39.781 | −7.99245 |
|  | 12.8947 | 16.4152 | 13.462 | 29.2292 |

TABLE 1-continued

|  | $R_{(\theta max)}$ | $\theta_{max}$ | $\theta_{min}$ | Foci separation |
|---|---|---|---|---|
| SHELL 2 | 0.890785 | 68. | 57. | −0.903534 |
|  | 2.79478 | 41.2681 | 33.7254 | −6.78263 |
|  | 11.457 | 14.5362 | 11.7232 | 27.6862 |
| SHELL 1 | 0.588106 | 57. | 46. | −0.628384 |
|  | 2.31156 | 34.7233 | 27.4701 | −5.76651 |
|  | 10.2617 | 12.4465 | 9.7454 | 26.3949 |

The quantity $R(\theta_{max})$ ($R_o$ in FIG. 6B) is the distance between the object and the leading (proximal) edge of a given reflector portion in a given shell. The quantities $\theta_{max}$ and $\theta_{min}$ are acceptance angle parameters for a given reflector portion as described above in reference to FIG. 6B. The foci separation for the first (hyperbolically-shaped) reflector portion of each shell is the displacement of the hyperbola's virtual image location ($F_i^{hyperbola}$ in FIG. 6A) with respect to the object location (origin 360 in FIG. 8, and $F_o$ in FIG. 6A); the foci separation for the second (hyperbolically-shaped) reflector portion of each shell is the displacement of the hyperbola's virtual image location with respect to the virtual image location of the corresponding first reflector portion; the foci separation for the third (elliptically-shaped) reflector portion for each shell is the displacement of the ellipse's image location ($F_i^{ellipse}$ in FIG. 6A) with respect to the virtual image location of the corresponding second reflector portion.

As listed in Table 1, each shell of the example collector 350 accepts approximately 11 degrees ($\Delta\theta$) of the source located at the origin 360. In an embodiment where the reflector portions are circularly symmetric about the Z axis (e.g., ellipsoid and hyperboloid surfaces), such acceptances of the four shells results in overall acceptance of approximately 34.7% of the full $4\pi$ steradians of solid angle about the source located at the origin 360. The example collector 350 as characterized by Table 1 delivers the collected light to the image location (not shown) that is approximately 20 units away from the object location 360.

One can see that the collector 350 can be modified or augmented in a variety of ways to suit various design needs or desires. For example, as shown in Table 1, the lower acceptance boundary of the example collector 350 is approximately 46 degrees ($\theta_{min}$ of the first reflector 362a of the first shell 352). In one embodiment, at least a portion of the coverage of the angular range of approximately 0 to 46 degrees can be augmented by another collector assembly such as a one or two-reflection collector. Such augmentation is described below in greater detail.

FIG. 9 shows another example embodiment of a collector 390 having a plurality of shells 392, 394, 396, 398, with each shell comprises multiple reflector portions. In the example shown in FIG. 9, the reflector portions of the four shells 392, 394, 396, 398 are dimensioned and arranged so that leading edges (proximal ends) 402, 404, 406, 408 of the first reflector portions are separated from the source location (origin 400) by a substantially same amount.

In one embodiment of the collector 390 of FIG. 9, each of the four shells (392, 394, 396, 398) is formed by a hyperbola-hyperbola-ellipse configuration. And in one particular example design of such a configuration of the collector 390, the reflector portions are dimensioned and arranged in the manner as summarized in Table 2.

TABLE 2

|  | $R_0$ | $\theta_{max}$ | $\theta_{min}$ | Foci separation |
|---|---|---|---|---|
| SHELL 4 | 1 | 90 | 74.6622 | −1.0924 |
|  | 2.98561 | 54. | 42.4714 | −8.09739 |
|  | 13.199 | 18. | 13.7751 | 29.1898 |
| SHELL 3 | 1 | 74.6622 | 62.9904 | −1.01684 |
|  | 2.96235 | 45.1831 | 36.9662 | −7.27926 |
|  | 12.0709 | 15.704 | 12.644 | 28.2961 |
| SHELL 2 | 1 | 62.9904 | 53.7438 | −0.969085 |
|  | 2.93428 | 38.2985 | 32.0463 | −6.82311 |
|  | 11.4458 | 13.6066 | 11.2699 | 27.7922 |
| SHELL 1 | 1 | 53.7438 | 46.2127 | −0.937269 |
|  | 2.91061 | 32.7702 | 27.8119 | −6.53928 |
|  | 11.0587 | 11.7966 | 9.94334 | 27.4765 |

The quantities $R_o$, $\theta_{max}$, $\theta_{min}$, and foci separation are as described above in reference to Table 1. The example collector 390 as characterized by Table 2 delivers the collected light to the image location (not shown) that is approximately 20 units away from the object location 400.

As listed in Table 2, the leading edges 402, 404, 406, 408 of the first reflector portions of the four shells 392, 394, 396, 398 are spaced approximately 1 arbitrary unit from the source located at the origin 400. Such a design feature having a common selected leading edge distance may be beneficial in applications where a particular clearance between the source and the closest reflectors are needed and/or desired.

FIG. 9 further shows light rays that define the acceptance angle boundaries of the first reflector portions of the four shells 392, 394, 396, 398. In the particular example collector 390 described herein in reference to FIG. 9 and Table 2, the acceptance ranges of the first reflector portions are substantially contiguous. That is, the $\theta_{min}$ of the first reflector portion of the first shell 392 substantially coincides with the $\theta_{max}$ of the first reflector portion of the second shell 394, and so on. For such a configuration applied to the example collector of Table 2, at least some of the light rays that leave the first reflector portions are blocked by parts of subsequent reflector portions. As an example, consider a light ray that corresponds to the $\theta_{max}$ of the first reflector portion of the fourth shell 398. That ray reflects from a location close to the leading edge of the first reflector portion and emerges therefrom as a ray denoted as 412. The ray 412 is shown to be blocked (although the line is depicted as continuing) by an obstruction 410 near the distal part of the first reflector portion of the third reflector portion 396. FIG. 9 shows that there are a plurality of such obstructions in the example configuration 390.

Figure 10A:
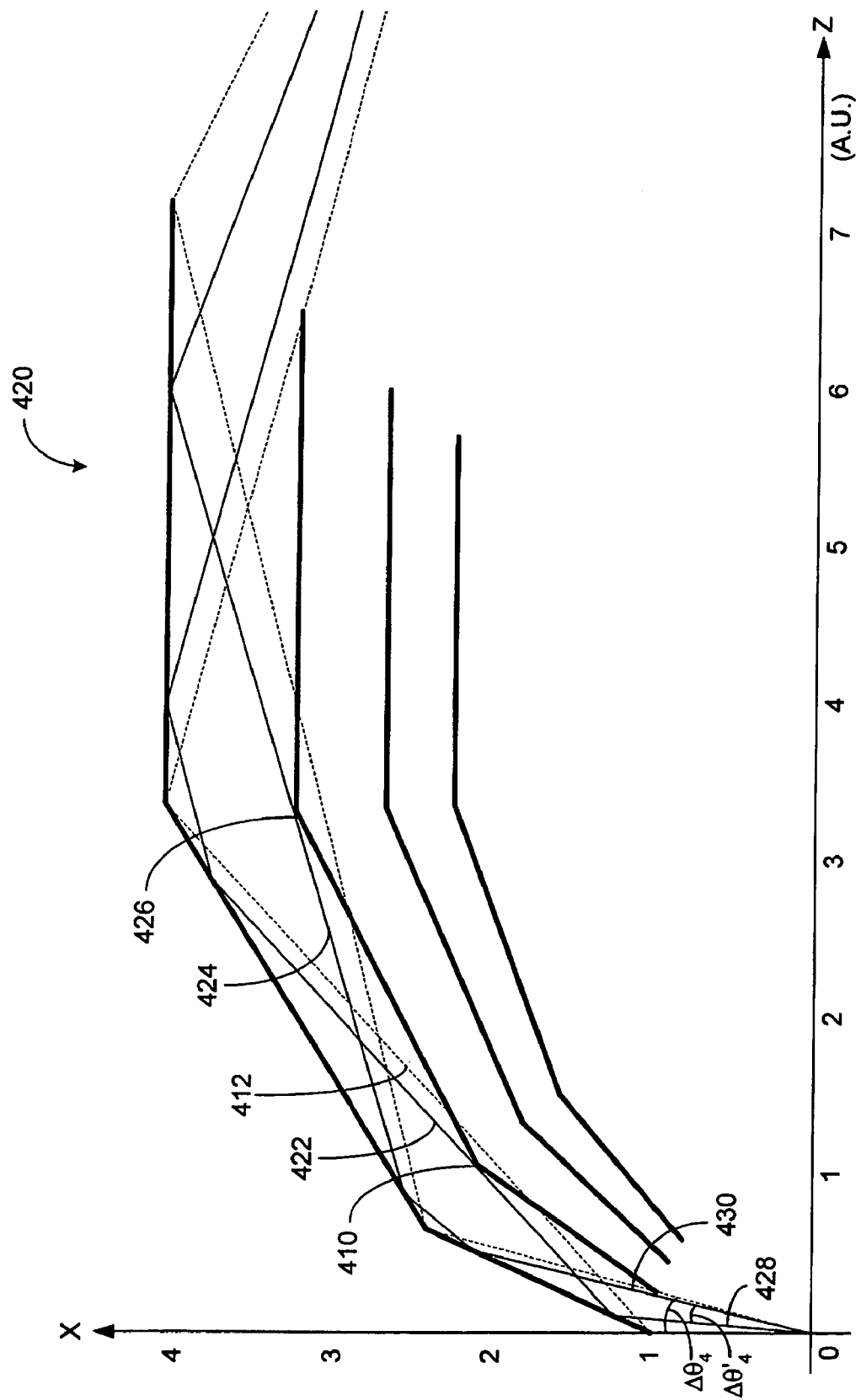
FIGS. 10A-B show how some of the shells can be modified to accommodate passage of portions of accepted light that may be blocked by portions of some of the shells.

Is some applications, such obstructions of a fraction of light between the shells may be acceptable and thus be of negligible consequences. Whether the reflector portions are left as-is or modified (example described below) is a question of design consideration that can be determined according to need and/or desire in a given application. FIG. 10A shows an example effect of keeping the reflector portions as-is (with respect to the example embodiment of FIG. 9), and FIG. 10B shows an example modification that can allow at least some of the previously-blocked light to proceed and be delivered to the target.

FIG. 10A shows one embodiment of a collector 420 depicting some of the effects of light obstruction when the collector is left as-is. For the purpose of description, the collector 420 is generally similar to the collector described above in reference to FIG. 9 with the reflectors left as-is. As shown in FIG. 10A, an example ray depicted as a dashed line 412 corresponds to propagation of the first reflector portion acceptance ($\Delta\theta_4$) boundary defining ray. Although the ray 412 is shown extending beyond the first reflection (for the purpose of visual reference), one can see that an obstruction 410 prevents it from reaching a second reflection.

FIG. 10A further depicts a reduced acceptance $\Delta\theta_4'$ defined by initial rays (solid lines) 428 and 430 that clears the subsequent obstructions. For example, the initial ray 428 clears the obstruction 410 as a ray 422. The other initial ray 430 clears an obstruction 426 as a ray 424.

Figure 10B:
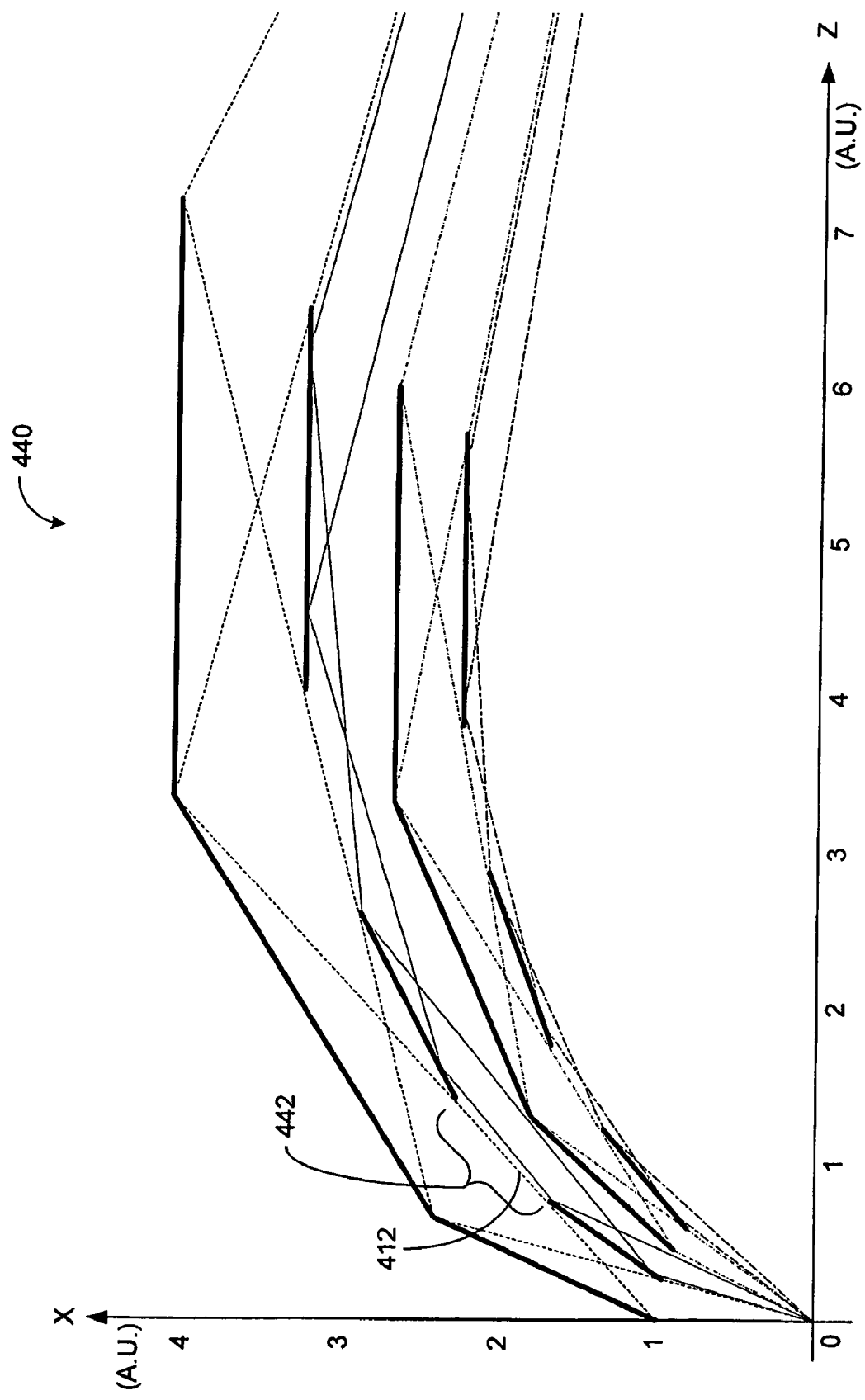

FIG. 10B shows an example of how the reflectors can be modified to allow passage of a shell's full acceptance ($\Delta\theta_4$) boundary defining rays. In one embodiment, the obstructions 410 and 426 (FIG. 10A) are substantially eliminated by removing parts of the respective ends of the reflector portions. In this particular example, the trailing edge of the first reflector portion and the leading edge of the second reflector portion of the third shell are trimmed so as to define a gap 442. Similar gaps are shown between the second and third reflector portions. These gaps therefore provide transmissive sections. Thus, the ray 412 that was blocked by the obstruction 410 in FIG. 10A is now allowed to pass, thereby providing a substantially full acceptance ($\Delta\theta_4$) for the fourth shell.

FIG. 10B further shows a similar modification to the first shell to provide a substantially full acceptance for the second shell. One can see that the modified first and third shells, while allowing substantially full acceptances for second and fourth shell, now have their own acceptances reduced. In this particular example, the first and third shells were modified for the sake of second and fourth shells. Many other modifications are possible, however, especially when the number of shells become larger. As an example for the four-shell configuration of FIG. 10A, the second shell can be modified to provide a substantially full acceptance for the third shell. In such a case, the second and fourth shell would have reduced acceptances, and the first and third shells would have substantially full acceptances.

From the description above in reference to FIGS. 8-10, one can see that various configurations of the shells and reflector portions therein can provide different overall acceptance performance. The example shown in FIG. 8 is based on a substantially same acceptance for each shell. In the particular example described in reference to Table 1 (and as shown in FIG. 8), there are substantial clearances between the backs of the shells and the spaces used by the light (except near the leading and trailing edges of the shells). The example shown in FIG. 9 is based on a substantially same distance between the source and the leading edges of the first reflector portions. In the particular example described in reference to Table 2 (and as shown in FIG. 9), some of the light can be obstructed by parts of the shells. FIG. 10A shows that such obstructions can be left alone, and FIG. 10B shows that different sections of the reflector portions can be modified to remove such obstructions.

Thus from the foregoing examples, one can readily see that a collector can be configured in a number of ways, depending on design needs and/or desires. Such design criteria may include, for example, properties of light sources and/or delivered light profile at the image location. If a given source emits light anisotropically with an intensity distribution as a function of angle, the reflector portions of one or more shells can be configured to capture such high-intensity emission regions. Similarly, if there is a preferred distribution of delivered light at the image location, one or more shells can be configured to promote such a distribution.

Another example of design criteria is the size of the collector assembly. In general, one can achieve a high numeric aperture by providing one or more, but few, relatively large shells. Alternatively, one can also achieve a high numeric aperture by providing a relatively large number of smaller-sized shells.

Such a high numeric aperture collector having relatively large number of smaller-sized shells is shown by way of example in FIG. 11. In one embodiment, a collector 450 includes eight shells 452a-h, and each shell is formed by three reflector portions. The overall size of the shells 452a-h in the collector 450 is substantially smaller, along both X (transverse) and Z (longitudinal) axes, than the example four-shell collector described above in reference to FIG. 8.

In one embodiment of the collector 450 of FIG. 11, each of the eight shells (452a-h) is formed by a hyperbola-hyperbola-ellipse configuration. And in one particular example design of such a configuration of the collector 450, the reflector portions are dimensioned and arranged in the manner as summarized in Table 3.

TABLE 3

|  | $R_{(\theta max)}$ | $\theta_{max}$ | $\theta_{min}$ | Foci separation |
|---|---|---|---|---|
| SHELL 8 | 1.56157 | 90. | 84. | −1.34367 |
|  | 2.672621 | 54. | 49.2893 | −5.85568 |
|  | 8.54645 | 18. | 16.2324 | 17.1993 |
| SHELL 7 | 1.34872 | 84. | 78. | −1.15194 |
|  | 2.44753 | 50.5892 | 46.0529 | −5.278 |
|  | 7.86936 | 17.1784 | 15.4716 | 16.4299 |
| SHELL 6 | 1.17223 | 78. | 72. | −0.997059 |
|  | 2.25454 | 47.1275 | 42.7412 | −4.80786 |
|  | 7.31653 | 16.2551 | 14.6032 | 15.8049 |
| SHELL 5 | 1.02198 | 72. | 66. | −0.868885 |
|  | 2.08509 | 43.6238 | 39.3666 | −4.41654 |
|  | 6.85534 | 15.2476 | 13.6449 | 15.2854 |
| SHELL 4 | 0.890603 | 66. | 60. | −0.760103 |
|  | 1.93252 | 40.085 | 35.939 | −4.0835 |
|  | 6.46243 | 14.1699 | 12.6111 | 14.8436 |
| SHELL 3 | 0.772427 | 60. | 54. | −0.66517 |
|  | 1.79124 | 36.5168 | 32.4665 | −3.79315 |
|  | 6.12015 | 13.0336 | 11.5134 | 14.4583 |
| SHELL 2 | 0.662877 | 54. | 48. | −0.57961 |
|  | 1.65604 | 32.9241 | 28.9557 | −3.53269 |
|  | 5.81407 | 11.8482 | 10.3618 | 14.1123 |
| SHELL 1 | 0.558056 | 48. | 42. | −0.499505 |
|  | 1.52159 | 29.3109 | 25.4121 | −3.29042 |
|  | 5.53115 | 10.6218 | 9.16454 | 13.7899 |

The quantities $R(\theta_{max})$, $\theta_{max}$, $\theta_{min}$, and foci separation are as described above in reference to Table 1.

The example collector 450 as characterized by Table 3 delivers the collected light to the image location (not shown) that is approximately 10 arbitrary units away from the object location (origin). In an embodiment where the reflectors 452 form annular sections about the Z axis, the collector 450 has an overall acceptance of approximately 37.1% of the full $4\pi$ steradians of solid angle about the source located at the origin (ignoring any obstructions).

Thus, one can see that a relatively smaller collector (e.g., 460 in FIG. 11) can be configured to have a relatively large acceptance with a relatively large number of smaller shells. For example, the approximately 37.1% acceptance of the collector 460 of Table 3 is larger than the approximately 34.7% acceptance of the collector of Table 1 (four shells).

As shown in Table 3, the lower boundary of acceptance of the collector 450 is approximately 42 degrees ($\theta_{min}$ of the first reflector portion of the first shell 452a). In one embodiment, the coverage of the angular range of approximately 0 to 42 degrees can be augmented by another collector assembly such as a one or two-reflection collector. Such augmentation is described below in greater detail. The one or two-reflection collector can include, by way of example, a Wolter-type collector (two grazing incidence reflections) and a single ellipse-shaped collector (one near normal incidence reflection).

Figure 12:
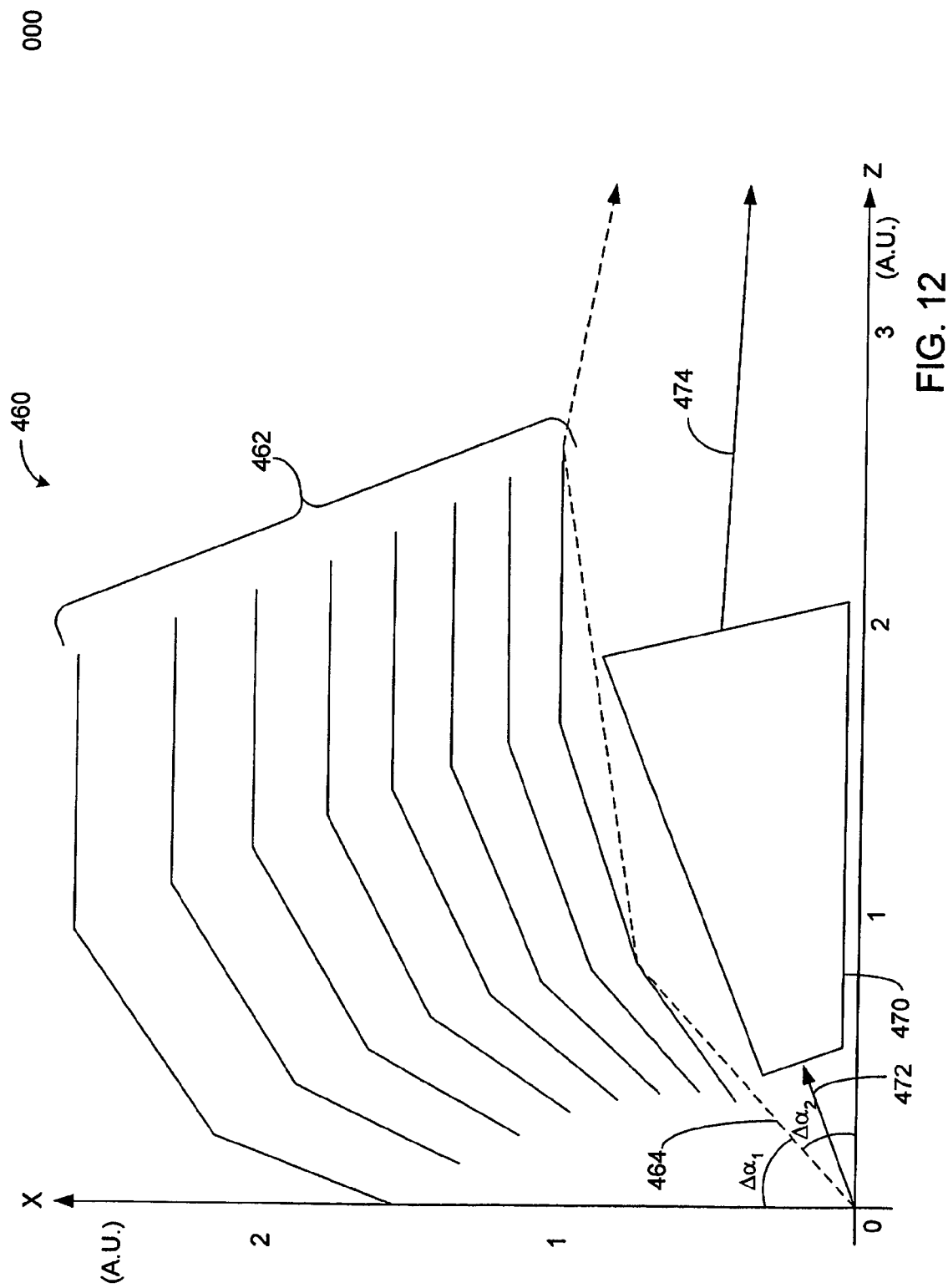
FIG. 12 shows the example eight-layer relay of FIG. 11 augmented with a relay that can provide coverage at smaller angles.

FIG. 12 shows an example of an augmented collector assembly 460 that includes a three-reflection multi-shell collector 462 and a one or two-reflection collector 470. In one embodiment, the three-reflection shell collector 462 is substantially similar to the collector described above in reference to FIG. 11, and has a lower boundary of acceptance of approximately 42 degrees (indicated by a boundary defining ray 464). A ray emitted at angles in the range of approximately 0 to 42 degrees (indicated by an arrow 472) is collected by the collector 470 and redirected as a ray 474. Thus, in such an example embodiment, the three-reflection shell collector 462 provides acceptance in the angular range $\Delta\alpha_1$ (approximately 42 to 90 degrees), and the one or two-reflection collector 470 provides acceptance in the angular range $\Delta\alpha_2$ (approximately 0 to 42 degrees). The auxiliary collector 470 also substantially covers the remaining area within the three-reflection shell 462.

Figure 13:
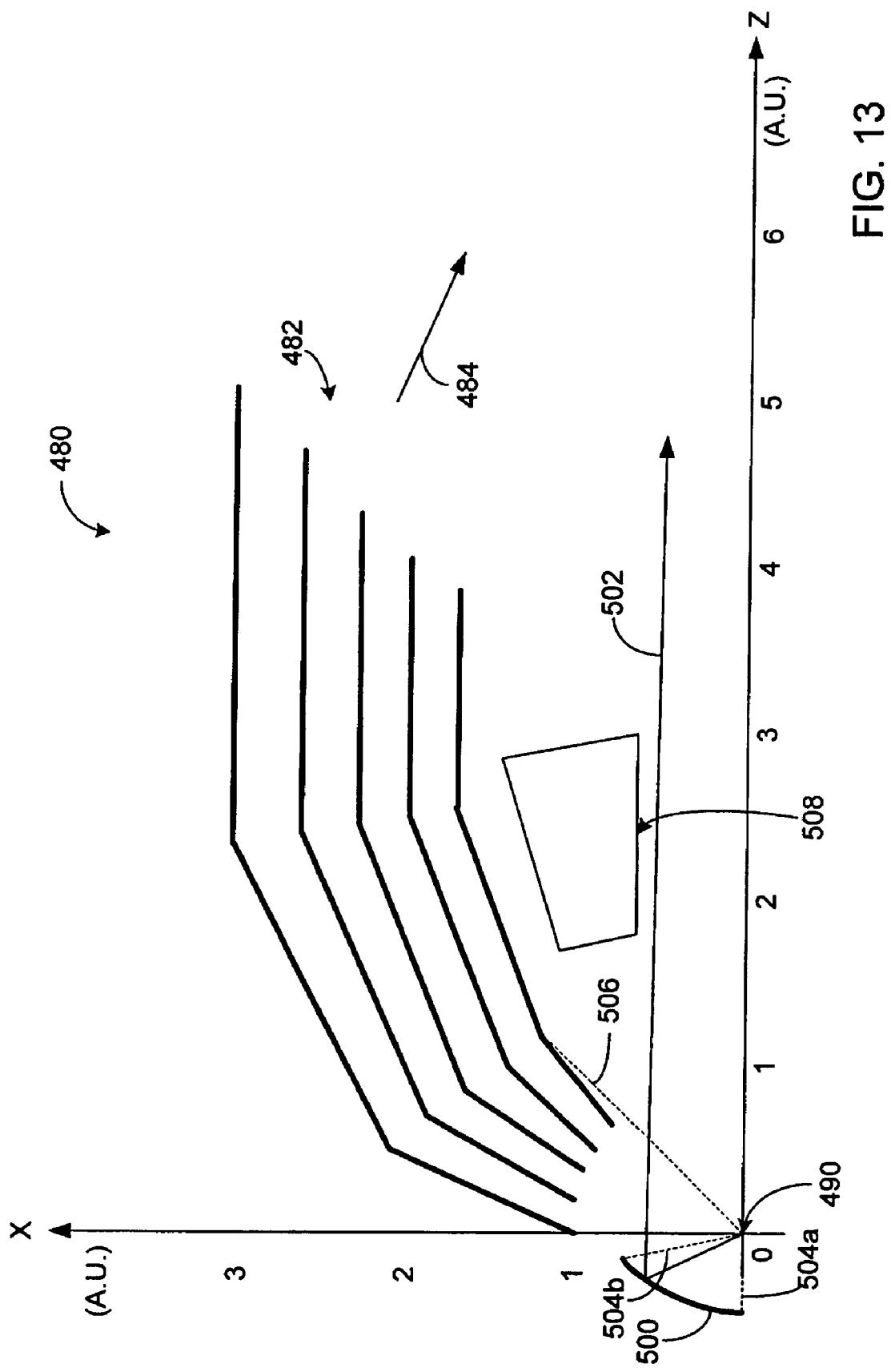
FIG. 13 shows one embodiment of an exemplary high numeric aperture relay having five nested shells, where the five-shell assembly is augmented with a normal-incidence type reflector assembly or reflector to further increase the overall acceptance.

FIG. 13 now shows an example of one embodiment of a hybrid collector assembly 480 that includes a grazing incidence collector 482 (in this example, a five-shell embodiment) and a second collector 500 dimensioned and positioned to collect light beyond the upper angular limit of the grazing incidence collector 482. In this particular example, the grazing incidence collector 482 accepts light in the range between a lower boundary defining ray 506 and a ray directed at an angle of approximately 90 degrees (not shown), and directs the collected light along a direction indicated by an arrow 484 towards an image location (not shown). As further shown in FIG. 13, the second collector 500 is positioned behind a source location 490 to accept light generally between dashed lines 504a and 504b and direct the collected light along a direction indicated by an arrow 502. In one embodiment, the second collector 500 achieves such collection by reflections that are generally normal incident (or close to normal) with respect to the reflecting surface of the second collector 500.

In one embodiment of the example hybrid collector 480, the grazing incident collector 482 includes five shells, with each shell having a hyperbola-hyperbola-ellipse configuration. The example grazing incident collector 482 has an acceptance range of approximately 45 to 90 degrees. The example second collector 500 is a segment of an ellipse, and has an acceptance range of approximately 104 to 180 degrees. In an embodiment where the collectors 482 and 500 form surfaces circularly symmetric about the Z axis (optical axis), the collector assembly 480 has an overall acceptance of approximately 73.2% of the full $4\pi$ steradians of solid angle about the source located at the origin (ignoring any obstructions).

In one embodiment, the example hybrid collector 480 further includes a third collector 508 that covers the region between the lower boundary of the acceptance of the grazing incident collector 482 and the region "above" the pathway of the light (502) on its way from the second collector 500 to the image location. In one embodiment, the third collector is a one or two-reflection collector dimensioned and positioned to cover a range of approximately 4 to 45 degrees. The second and third collector 500 and 508 also substantially covers the remaining area within the five-shell grazing incident collector 482. In an embodiment where the collectors 482, 500, and 508 comprise surfaces that are circularly symmetric about the Z axis, the collector assembly 480 has an overall acceptance of approximately 87.7% of the full $4\pi$ steradians of solid angle about the source located at the origin (ignoring any obstructions).

Figure 14B:
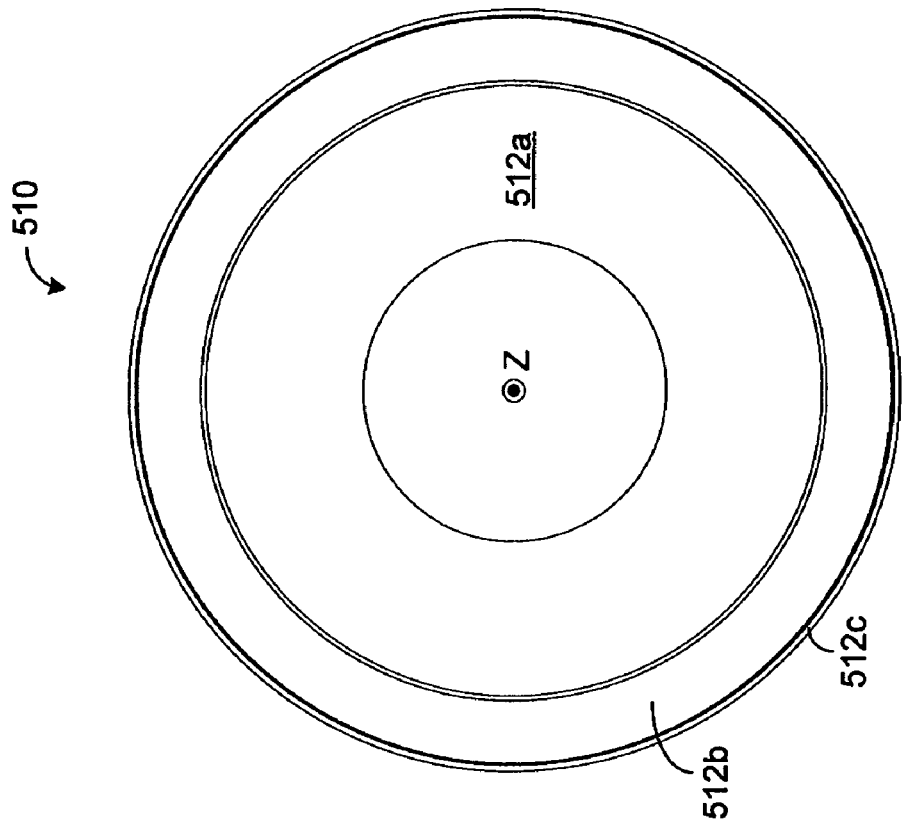
FIGS. 14A-B show side and end views of one example shell having three reflector portions, where each reflector portion provides substantially full azimuthal coverage about an optical axis.
Figure 14A:
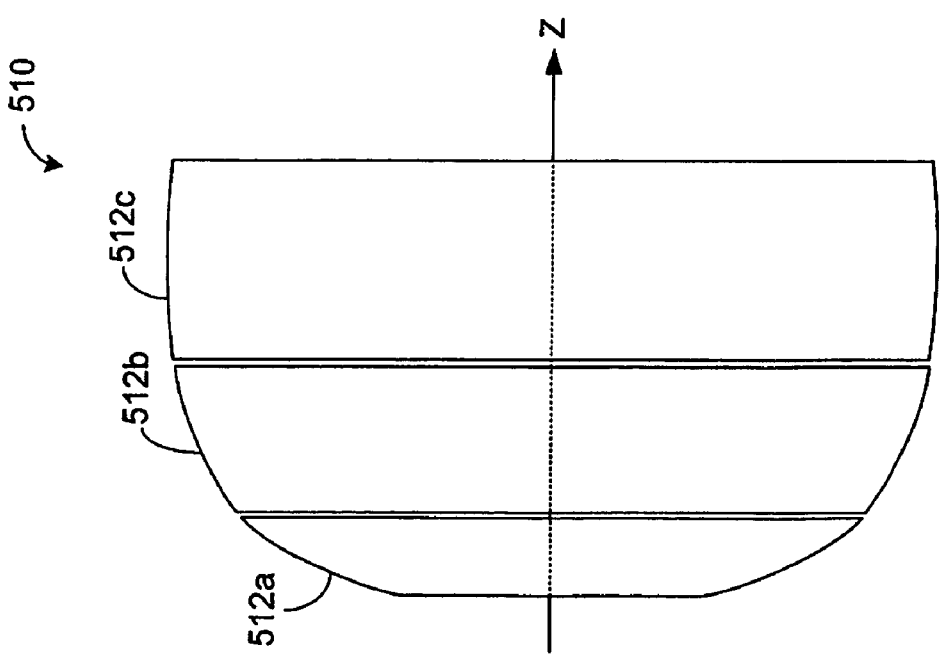

In the various example embodiments described above in reference to FIGS. 8-13, some total acceptance estimates are given for embodiments where the reflector portions of the shell(s) form annular surfaces disposed about the Z axis (optical axis). FIGS. 14A and B now show side and end views of such annular reflector portions for one example shell 510. The shell 510 includes three reflector portions 512a, b, and c. In one embodiment, the three reflector portions 512a-c are formed by a hyperbola-hyperbola-ellipse configuration. From the example shell 510 of FIGS. 14A and B, one can see that such a circularly symmetric structure of the reflector portions facilitates collection of substantially all of the azimuthally distributed light that is emitted within the polar angular acceptance range of the reflector portions 512.

Figure 15B:
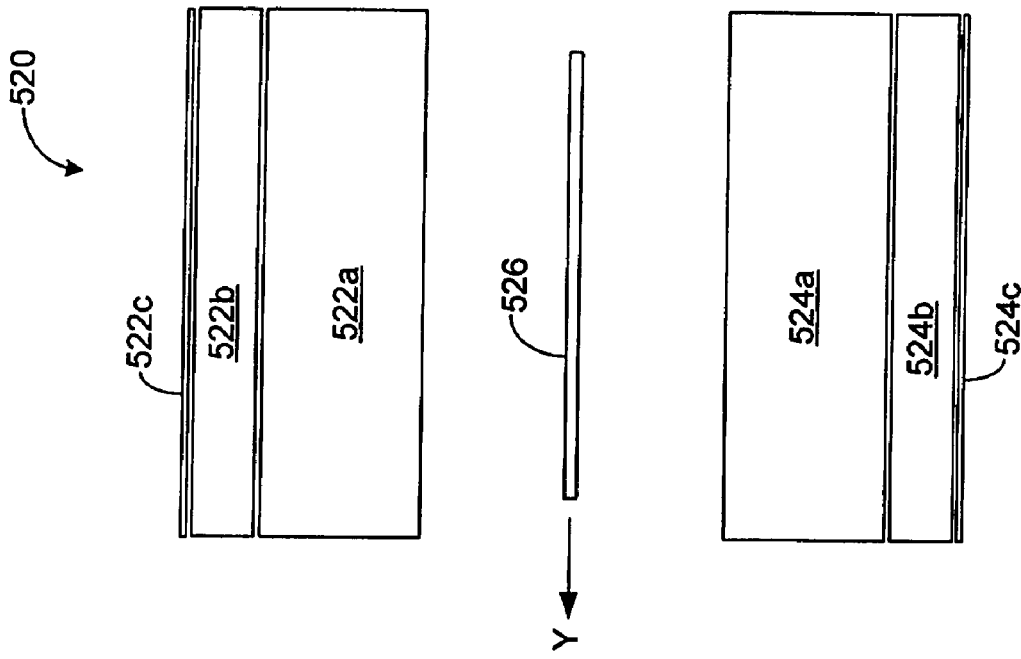
FIGS. 15A-B show side and end views of one example shell having three reflector portions, where each reflector portion can be shaped to provide reflection along one transverse direction with respect to the optical axis such that light from shaped sources such as line sources can be relayed in a manner that generally preserves the profile of the shaped source.
Figure 15A:
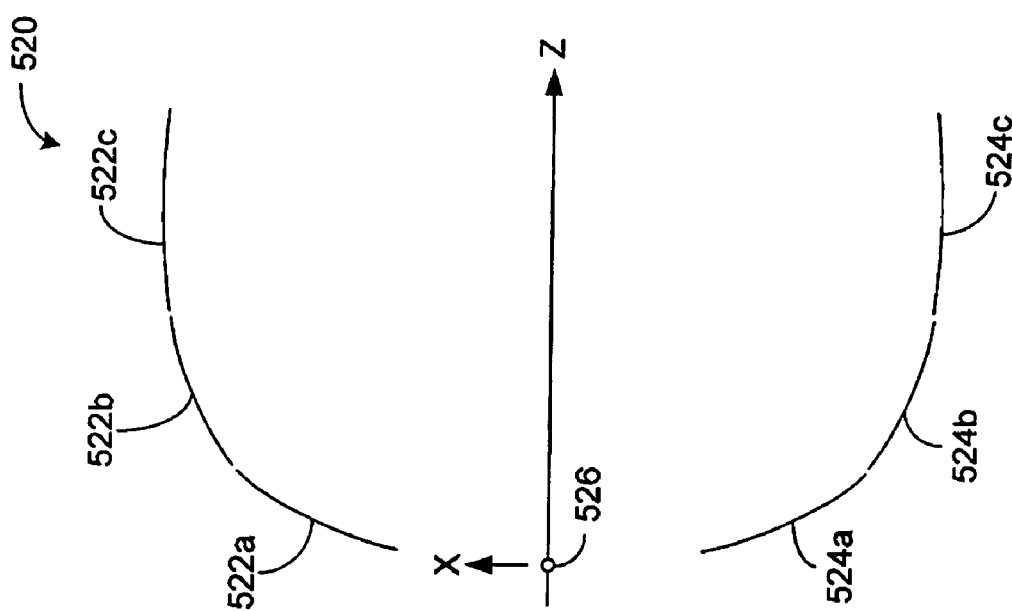

FIGS. 15A and B now show that the various embodiments of the reflectors described herein do not necessarily have annular shaped structures. As shown in side and end views of FIGS. 15A and B, one embodiment of a "shell" 520 includes three reflector portions 522a, b, and c (and 524a, b, and c). In one embodiment, the three reflector portions 522a-c (and 524a-c) are formed by three cylindrical surfaces that extend along the Y axis (FIG. 15B), and have respective hyperbolic, hyperbolic, and elliptical cross-sectional curvatures in the X-Z plane (FIG. 15A).

The cylindrical reflector portions described above in reference to FIGS. 15A and B are cylindrical mirrors curved along one axis. Additionally, each cylindrical shaped reflector portion has an axis that extends substantially parallel to the direction of the cylindrical extension. In the example embodiment of FIGS. 15A and B, all of the three cylindrical reflector portions' axes are substantially parallel to the Y axis.

Such shell(s) formed by shaped cylindrical reflector portions 522 can be used to shape the delivered light profile at the image location (not shown), and/or to accommodate non-spherical light sources such as a line source 526 (which in this example extends along the Y axis). Like cylindrical lenses, these cylindrical reflector elements 522 have power on one direction. Thus in the example embodiment 520 shown in FIGS. 15A and B, light collection by reflection is achieved by "positive" power reflections (i.e., reflection from concave curvature in the X direction) for rays in the X-Z plane, and by substantially "zero" power reflections (i.e., reflection in a substantially non-curved orthogonal Y direction) for Y-component of the rays.

Figure 16:
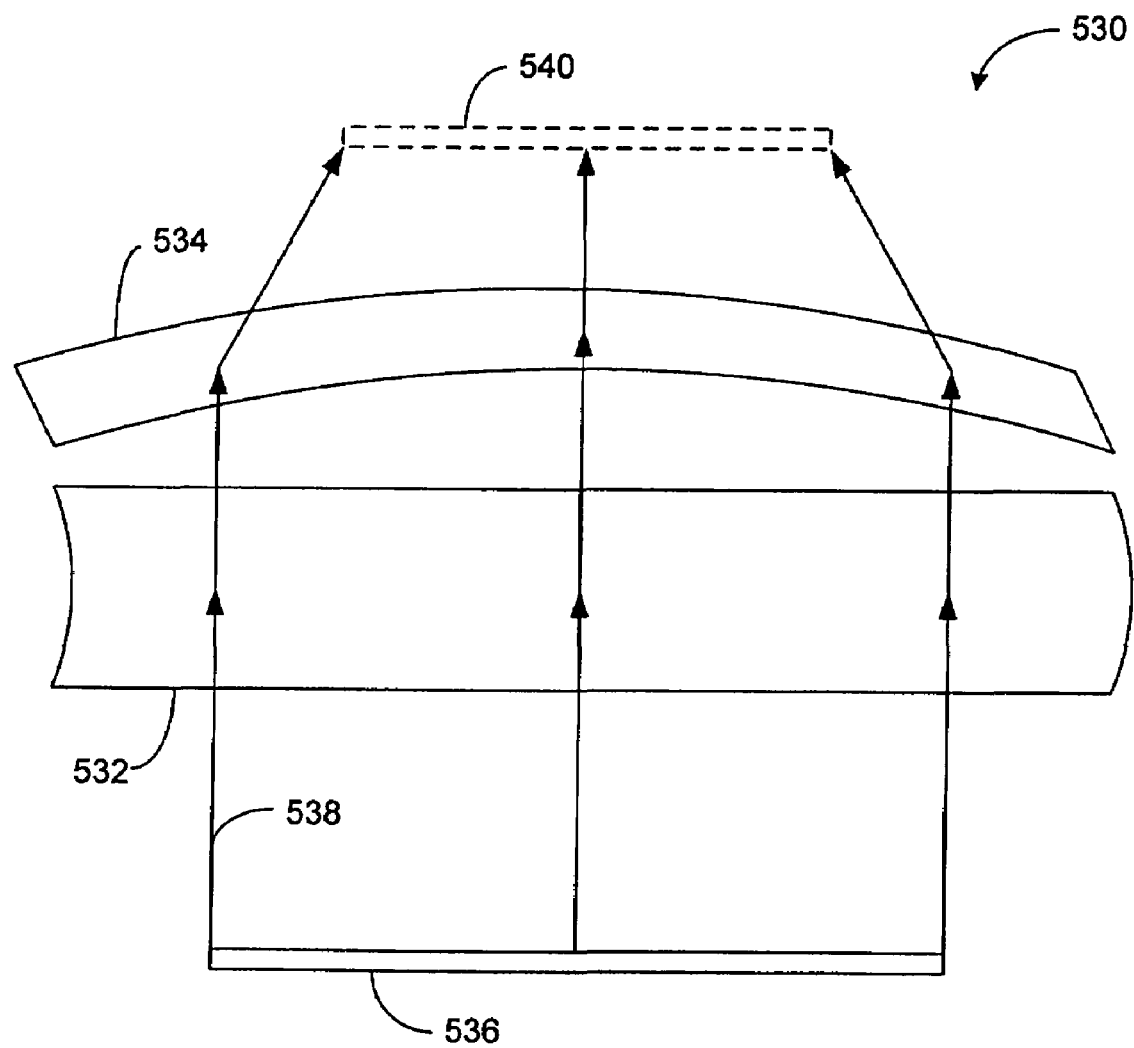
FIG. 16 shows one embodiment of a reflector assembly having two crossed one-dimensional reflector portions so that the profile of a shaped source can be altered into another shape at the image location.

FIG. 16 now shows that in one embodiment, an assembly 530 of reflectors can include a pair of such cylindrically shaped reflector portions 532 and 534 so that the direction with power of the first cylindrical reflector portion 532 is substantially perpendicular to direction with power in the second cylindrical reflector portion. A collector having such an assembly of reflectors can be used to manipulate the profile of the delivered light. For example, a line light source 536 is shown to emit example rays 538 towards the reflector portions 532 and 534. The first reflection from the first cylindrical reflector portion 532 substantially maintains the profile of the line source 536, similar to each reflection in the collector 520 of FIGS. 15A and B. The second reflection from the second cylindrical reflector portion 534 is shown to reduce the size of the line source 536 to yield an image 540. Such a reduced image (540) can be reduced further by another pair of crossed cylindrical reflector elements, or if the second cylindrical reflector element 534 has an appropriate curvature, the reduced image 540 can be collapsed to a substantially point image at the image location.

In other embodiments, other types anamorphic reflecting surfaces having different power along different directions may be used. For example, the power need not be zero along one direction. The directions also need not be orthogonal. Still other shapes are possible.

Figure 17:
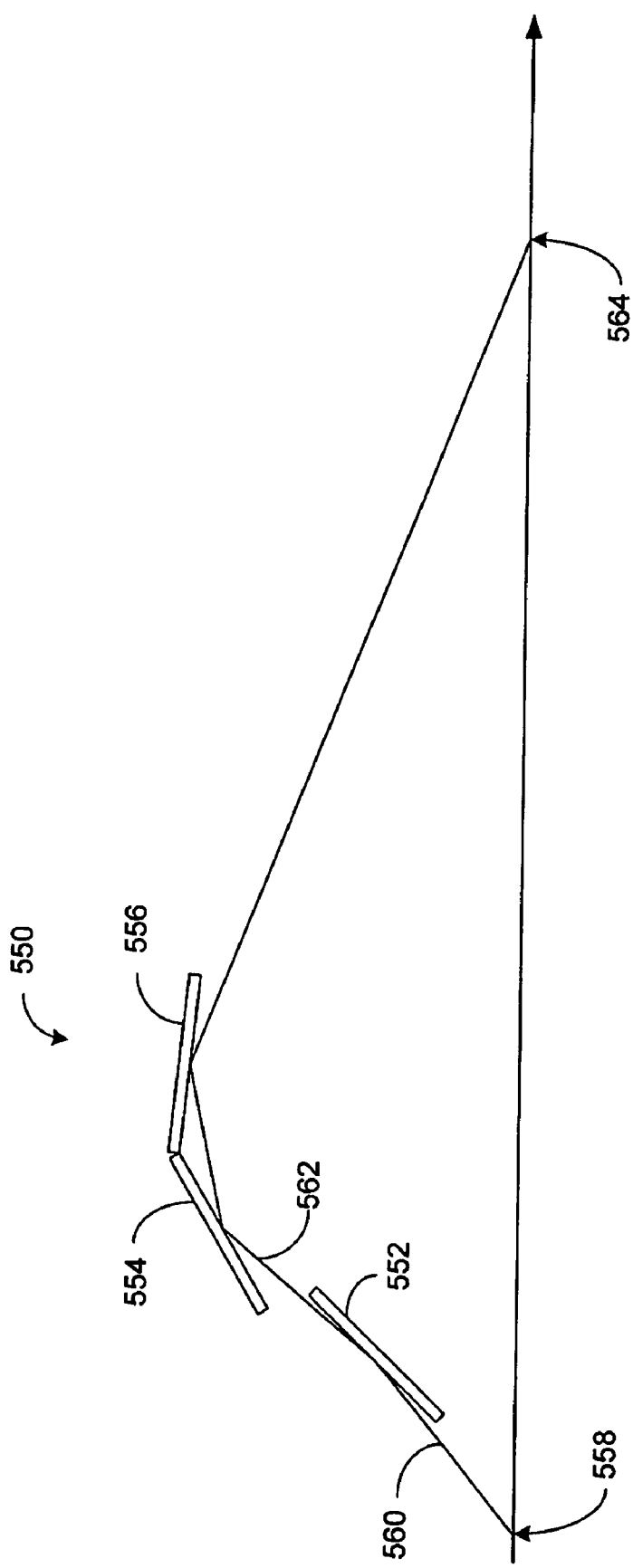
FIGS. 17-18 show example embodiments of reflector assemblies having at least one reflector portion that provides a negative-power reflection.
Figure 18:
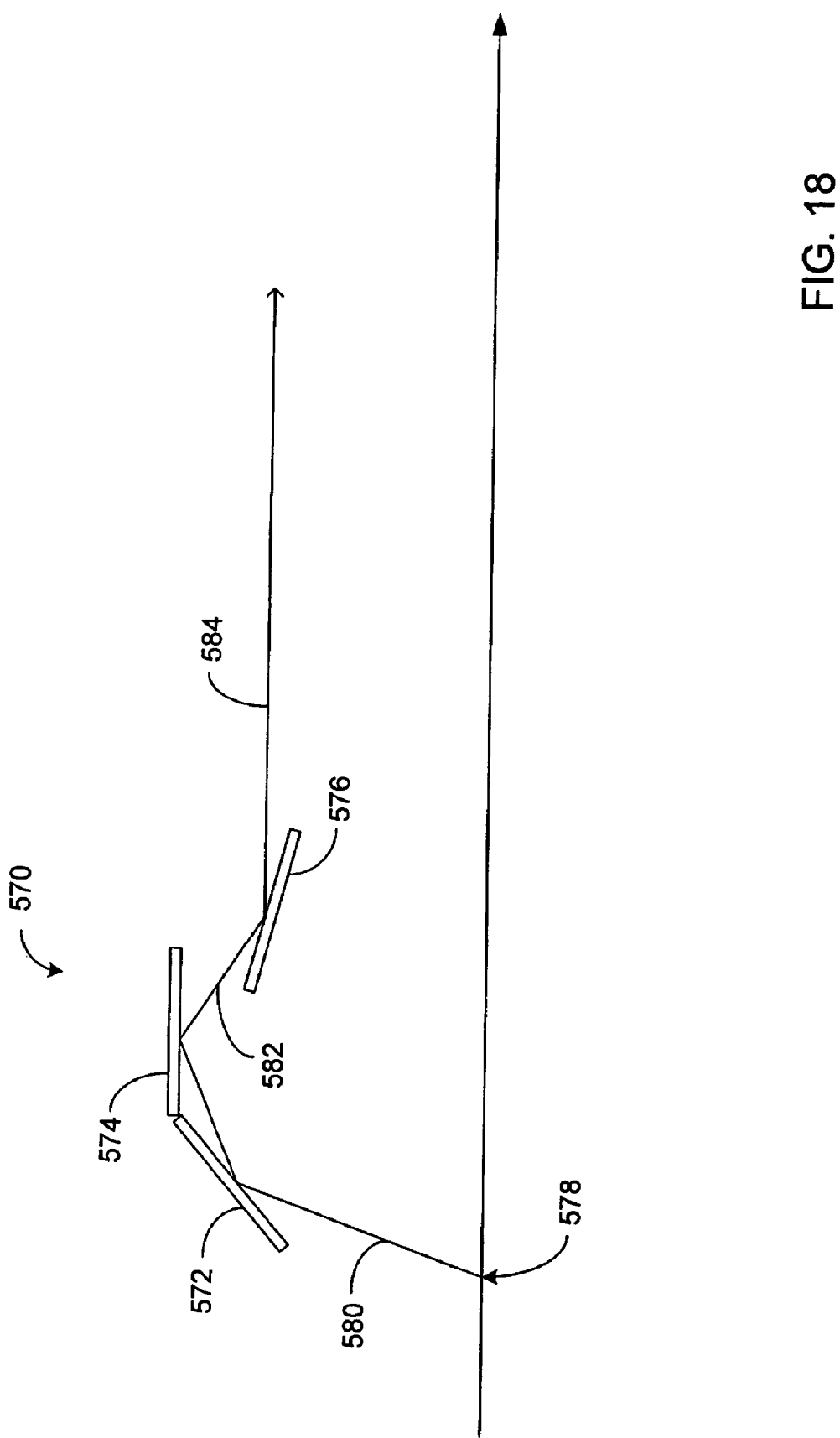

FIGS. 17 and 18 now show that one or more "negative" power reflections (i.e., reflection from the convex side) can be incorporated in one or more "shell(s)" of the various embodiments of the grazing incident reflection collectors. FIG. 17 shows an example embodiment of a collector 550 having a shell formed by a negative power reflector element 552 followed by two positive power reflector elements 554 and 556 (reflection form concave side). In such a configuration, a light ray 560 from a source 558 reflects from the convex side of the reflector element 552 into a ray 562. The ray subsequently reflects from the concave sides of the reflector elements 554 and 556 in a manner similar to that described herein, so as to be delivered to an image location 564.

In one embodiment, the negative power reflector element 552 comprises a hyperbolic surface; the first positive power reflector element 554 comprises an elliptical surface; and the second positive power reflector element 556 comprises an elliptical surface. Such a system can be configured to be generally equivalent to a wide-angle type optical configuration with a corresponding real image location.

In one embodiment, the second positive reflector element 556 can be replaced by a parabolic element to place the image at a location substantially far from the object (e.g., infinity). Also in another embodiment, the second positive reflector element 556 can be replaced by a hyperbolic element if a virtual image of the source is needed and/or desired.

FIG. 18 shows an example embodiment of a collector 570 having a shell formed by two positive power reflector elements 572, 574, followed by a negative power reflector element 576. In such a configuration, a light ray 580 from a source 578 reflects from the concave sides of the reflector elements 572 and 574 into a ray 582. The ray 582 then reflects from the convex side of the reflector element 576 into a ray 584 to be delivered to an image location (not shown).

In one embodiment, the first and second positive power reflector elements 572 and 574 have hyperbolic shaped surfaces, and the negative power reflector element 576 has a parabolic surface. Such a system can be configured to be generally equivalent to a telephoto type optical configuration with a corresponding real image location that is substantially far from the object location (e.g., infinity).

In various embodiments, the negative reflector element 576 can be replaced by an element having an hyperbolic or elliptical surfaces. Accordingly, an image that is real and at an intermediate and accessible location or a virtual image of the source may be provided as needed and/or desired.

It will be understood that the foregoing example collectors 550 and 570 of FIGS. 17 and 18 can be annular or cylindrical reflective structures or any combination thereof configurations as described herein. One can also readily see that many other configurations are possible with a negative power reflector. For example, a shell can be configured as having a positive-negative-positive configuration. Furthermore, a negative power reflector can be a part of a shell having more than three reflectors. Furthermore, a collector having more than one shell can have a negative reflector in at least one of those shells. Furthermore, the foregoing exemplary configurations can be augmented with other collectors to increase the overall acceptance. Other variations are also possible.

The reflective portions in the various relays described herein may be fabricated using a variety of different methods. For example, the reflective portions may be formed in a substrate by polishing the substrate to form curved regions. Reflective material may deposited on the curved regions. Alternatively, a plurality of bases having curved surfaces that define the grazing incidence reflector portions may be attached together. Reflective material may be deposited on the curved surfaces. In certain embodiments, mirrors having reflective surfaces that form the grazing incidence reflector portions are attached together. In some embodiments, a plurality of mirrors having reflective surfaces that form the grazing incidence reflector portions are mounted on a common support structure.

Accordingly, many variations in the design are possible. For example, although the reflective surfaces may have elliptical, parabolic, or hyperbolic curvatures, aspheric surfaces may also be used. As described above, the aspheric surfaces may be substantially elliptical, parabolic, or hyperbolic yet may deviate from perfect elliptical, parabolic, or hyperbolic shapes. These aspheres may include an additional "aspheric" contribution that alters the shape from the perfectly elliptical, parabolic, or hyperbolic. Such a surface may be fit to an elliptical, parabolic, or hyperbolic shape to yield a best fit conic. Contributions to sag will result from the best fit conic as well as the aspheric contribution. In certain embodiments, the aspheric contribution to sag may be no more that about 25% of the contribution of the best fit conic shape. In other embodiments, the aspheric contribution to sag may be no more than about 10% of the sag contribution of the best fit conic shape. For example, the deviation of the aspheric surface from the best fit conic shape (e.g., which may be an ellipse) may be less than about 5% of the conic (e.g., elliptical) contribution to sag. Values outside these ranges are possible in other embodiments.

A wide variety of other variations are also possible.

Advantageously, the various example embodiments of collectors described herein as having three or more reflectors (per layer or shell) can provide flexibility in designing a high acceptance device with a high reflection efficiency. As described above in reference to FIG. 4, for example, certain reflections are more efficient at low grazing angles. Having three or more reflectors allows for better utilization of such high efficient grazing angle reflections, while maintaining a high acceptance.

As described above, the apparatus and methods described herein may be used for wavelengths other than UV and x-ray light, such as, e.g., visible light. In some embodiments, for example, collectors may be used with visible light emitting diode (LED), incandescent, or fluorescent light sources. These light sources may be extended light sources such as line or area sources in some cases but are not to be so limited.

Systems and methods using a light collector having three or more different reflectors may further allow efficient grazing angle reflections with a relatively high acceptance of light from a source. The collected light can be delivered to a selected location for various applications, including semiconductor lithography. Other applications including but not limited to medical treatment and diagnostics, spectroscopy, security, lighting, are possible. Other applications are also possible.

Although the above-disclosed embodiments have shown, described, and pointed out the fundamental novel features of the invention as applied to the above-disclosed embodiments, it should be understood that various omissions, substitutions, and changes in the form of the detail of the devices, systems, and/or methods shown may be made by those skilled in the art without departing from the scope of the invention. Consequently, the scope of the invention should not be limited to the foregoing description, but should be defined by the appended claims.

What is claimed is:

1. A grazing incidence reflector comprising:
   an elliptically shaped grazing incidence reflector portion; and
   a plurality of hyperbolically shaped grazing incidence reflector portions,
   wherein said hyperbolically shaped reflecting portions are positioned on opposite sides of said elliptically shaped portion,
   such that light rays reflect at grazing incidence from a first of said plurality of hyperbolically shaped reflecting portions, to said elliptically shaped reflecting portion, and onto a second of said plurality of hyperbolically shaped reflecting portions.

2. The grazing incidence reflector of claim 1, wherein said first and second hyperbolically shaped reflecting portions and said elliptically shaped reflecting portion comprise cylindrical surfaces having power along a first axis.

3. The grazing incidence reflector of claim 2, further comprising additional cylindrical surfaces having power along a second axis substantially orthogonal to said first axis.

4. The grazing incidence reflector of claim 1, wherein at least one of said first and second hyperbolically shaped reflecting portions and said elliptically shaped reflecting portion comprise an aspheric reflecting surface.

5. The grazing incidence reflector of claim 4, wherein said aspheric reflecting surface provides an aspheric contributions to sag no more that about 10% of the contribution to sag of an elliptical or hyperbolic shape that is a best fit to said aspheric reflecting surface.

6. A method of fabricating a grazing incidence reflector comprising:
   positioning a plurality of substantially hyperbolically shaped grazing incidence reflector portions with respect to a substantially elliptically shaped grazing incidence reflector portion such that light rays reflect from said grazing incidence reflector portions at grazing angles,
   wherein said hyperbolically shaped reflecting portions are positioned on opposite sides of said elliptically shaped portion such that light rays reflect at grazing incidence from a first of said hyperbolically shaped reflecting portion to said elliptically shaped reflecting portion.

7. The grazing incidence reflector formed by the method of claim 6.

8. The method of claim 6, wherein said hyperbolically shaped reflecting portions are positioned such that said light rays reflect at grazing incidence from the first of said hyperbolically shaped reflecting portion, to said elliptically shaped reflecting portion, and onto a second of said plurality of hyperbolically shaped reflecting portions.

9. The method of claim 6, wherein said hyperbolically shaped portions and said elliptically shaped portion comprise cylindrical surfaces having power along a first axis.

10. The method of claim 9, further comprising additional cylindrical surfaces having power along a second axis substantially orthogonal to said first axis.

11. The method of claim 6, wherein at least one of said hyperbolically shaped portions and said elliptically shaped portion comprise an aspheric reflecting surface.

12. The method of claim 11, wherein said aspheric reflecting surface provides an aspheric contributions to sag no more that about 10% of the contribution to sag of an elliptical or hyperbolic shape that is a best fit to said aspheric reflecting surface.

13. A grazing incidence relay comprising three relay stations, said three relay stations comprising first, second, and third grazing incidence reflector portions respectively, said relay stations disposed with respect to each other such that light rays reflect at grazing incidence from said first grazing incidence reflector portion, to said second grazing incidence reflector portion,
   wherein said first and third grazing incidence reflector portions are hyperbolically shaped and are located on opposite sides of said second grazing incidence reflector portion, and
   wherein said second grazing incidence reflector portion is elliptically shaped.

14. The grazing incidence relay of claim 13, wherein said relay stations are disposed with respect to each other such that said light rays reflect at grazing incidence from said first grazing incidence reflector portion, to said second grazing incidence reflector portion, and onto said third grazing incidence reflector portion.

15. The grazing incidence relay of claim 13, comprising only three relay stations.

16. The grazing incidence relay of claim 13, wherein said first, second and third portions comprise cylindrical surfaces having power along a first axis.

17. The grazing incidence relay of claim 16, further comprising additional cylindrical surfaces having power along a second axis substantially orthogonal to said first axis.

18. The grazing incidence relay of claim 13, wherein at least one of said first, second and third portions comprise an aspheric reflecting surface.

19. The grazing incidence relay of claim 18, wherein said aspheric reflecting surface provides an aspheric contributions to sag no more that about 10% of the contribution to sag of an elliptical or hyperbolic shape that is a best fit to said aspheric reflecting surface.

20. A method of fabricating a relay comprising only three relay stations, said method comprising:
   locating first and second grazing incidence reflector portions such that light reflected at grazing incidence from said first grazing incidence reflector portion is reflected at grazing incidence to said second grazing incidence reflector portion; and
   locating a third grazing incidence reflector portion with respect to said second grazing incidence reflector portion,
   wherein said first, second, and third grazing incidence reflector portions comprise said only three reflector stations,
   wherein said first and third grazing incidence reflector portions are hyperbolically shaped and are located on opposite sides of said second grazing incidence reflector portion, and
   wherein said second grazing incidence reflector portion is elliptically shaped.

21. The method of claim 20, further comprising locating the third grazing incidence reflector portion with respect to said second grazing incidence reflector portion such that said light reflected at grazing incidence from said second grazing incidence reflector portion is reflected at grazing incidence to said third grazing incidence reflector portion.

22. The method of claim 20, wherein said first, second and third portions comprise cylindrical surfaces having power along a first axis.

23. The method of claim 22, further comprising additional cylindrical surfaces having power along a second axis substantially orthogonal to said first axis.

24. The method of claim 20, wherein at least one of said first, second and third portions comprise an aspheric reflecting surface.

25. The method of claim 24, wherein said aspheric reflecting surface provides an aspheric contributions to sag no more that about 10% of the contribution to sag of an elliptical or hyperbolic shape that is a best fit to said aspheric reflecting surface.

26. A method of relaying light from an object location to an image location with only three relay stations, said method comprising:

reflecting light from said object location at grazing incidence off a first reflecting surface to a second reflecting surface;

reflecting said light at grazing incidence off said second reflecting surface to a third reflecting surface; and reflecting said light at grazing incidence off said third reflecting surface to said image location, wherein said first, second, and third reflecting surfaces comprise said only three relay stations, wherein said first and third reflecting surfaces are hyperbolically shaped and are located on opposite sides of said second reflecting surface, and wherein said second reflecting surface is elliptically shaped.

27. The method of claim 26, wherein said first, second and third surfaces comprise cylindrical surfaces having power along a first axis.

28. The method of claim 27, further comprising additional cylindrical surfaces having power along a second axis substantially orthogonal to said first axis.

29. The method of claim 26, wherein at least one of said first, second and third surfaces comprise an aspheric reflecting surface.

30. The method of claim 29, wherein said aspheric reflecting surface provides an aspheric contributions to sag no more that about 10% of the contribution to sag of an elliptical or hyperbolic shape that is a best fit to said aspheric reflecting surface.

* * * * *

UNITED STATES PATENT AND TRADEMARK OFFICE
CERTIFICATE OF CORRECTION

| | | |
|---|---|---|
| PATENT NO. | : 7,481,544 B2 | Page 1 of 1 |
| APPLICATION NO. | : 11/066606 | |
| DATED | : January 27, 2009 | |
| INVENTOR(S) | : James P. McGuire | |

It is certified that error appears in the above-identified patent and that said Letters Patent is hereby corrected as shown below:

In Column 18, Line 25, Change "that about" to --than about--.

In Column 19, Line 31, In Claim 5, Change "that about" to --than about--.

In Column 19, Line 65, In Claim 12, Change "that about" to --than about--.

In Column 20, Line 33, In Claim 19, Change "that about" to --than about--.

In Column 21, Line 6, In Claim 25, Change "that about" to --than about--.

In Column 22, Line 17, In Claim 30, Change "that about" to --than about--.

Signed and Sealed this

Twenty-third Day of June, 2009

JOHN DOLL
*Acting Director of the United States Patent and Trademark Office*